(12) United States Patent
Okamoto et al.

(10) Patent No.: US 8,950,873 B2
(45) Date of Patent: Feb. 10, 2015

(54) LIGHT SOURCE APPARATUS AND PROJECTOR

(71) Applicant: Ushio Denki Kabushiki Kaisha, Tokyo (JP)

(72) Inventors: Masashi Okamoto, Hyogo (JP); Takanori Samejima, Hyogo (JP); Mikio Shimizu, Hyogo (JP); Yuichi Miura, Hyogo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 56 days.

(21) Appl. No.: 13/918,894

(22) Filed: Jun. 14, 2013

(65) Prior Publication Data
US 2013/0335710 A1    Dec. 19, 2013

(30) Foreign Application Priority Data

Jun. 15, 2012    (JP) .................................. 2012-135397

(51) Int. Cl.
*G03B 21/14*    (2006.01)
*G03B 21/20*    (2006.01)
(Continued)

(52) U.S. Cl.
CPC .............. *G03B 21/2033* (2013.01); *G02F 1/29* (2013.01); *G02B 27/48* (2013.01); *G03B 21/14* (2013.01);
(Continued)

(58) Field of Classification Search
CPC ...... G03B 21/14; G03B 21/147; G03B 21/20; G03B 21/2013; G03B 21/2033; G03B 21/2046; G03B 21/2066; G03B 21/208; G03B 33/06; G03B 33/08; H04N 9/31; H04N 9/3111; H04N 9/3129; H04N 9/3135; H04N 9/3161; G02B 27/48; G02B 19/0057; H01S 5/005; H01S 5/4012; H01S 5/4093; H01S 3/005; G02F 1/29
USPC ........ 353/30–31, 85, 94, 98, 102, 122; 372/9, 372/24; 362/259, 553
See application file for complete search history.

(56) References Cited

U.S. PATENT DOCUMENTS 6,773,120 B2 *    8/2004    Colpaert ........................ 353/122
7,413,311 B2 *    8/2008    Govorkov et al. .............. 353/34
(Continued)

FOREIGN PATENT DOCUMENTS

JP    S59-024823 A    2/1984
JP    H10-133303 A    5/1998
(Continued)

*Primary Examiner* — Tony Ko
*Assistant Examiner* — Jori S Reilly-Diakun

(57) ABSTRACT

A coherent light source apparatus comprises a first optical system, which has a first light emission region formed by a coherent light source, and which projects light from the first light emission region to form a second light emission region, a light deflection unit which deflects light flux in connection with formation of the second light emission region; a second optical system, which forms a third light emission region in response to the light flux which has been deflected by the light deflection unit, a light mixing unit for mixing a component of an incident light angle and that of a position thereof, and a light deflection unit drive circuit for receiving a periodic optical deflection synchronization signal, thereby driving the light deflection unit, wherein the light deflection unit operates to continuously change a direction in which the light flux is deflected while synchronizing with the optical deflection synchronization signal.

9 Claims, 14 Drawing Sheets

(51) Int. Cl.
  *G02B 27/48* (2006.01)
  *G02F 1/29* (2006.01)
  *H04N 9/31* (2006.01)
  *G02B 19/00* (2006.01)
  *H01S 3/00* (2006.01)
  *H01S 5/00* (2006.01)
  *H01S 5/40* (2006.01)
  *G03B 33/06* (2006.01)
  *G03B 33/08* (2006.01)

(52) U.S. Cl.
  CPC ........ *G03B 21/2013* (2013.01); *G03B 21/2066* (2013.01); *G03B 21/208* (2013.01); *H04N 9/3111* (2013.01); *H04N 9/3161* (2013.01); *G02B 19/0057* (2013.01); *H01S 3/005* (2013.01); *H01S 5/005* (2013.01); *H01S 5/4012* (2013.01); *H01S 5/4093* (2013.01); *G03B 33/06* (2013.01); *G03B 33/08* (2013.01)

USPC .................... 353/85; 353/94; 372/9; 362/259

(56) References Cited

U.S. PATENT DOCUMENTS

| | | | |
|---|---|---|---|
| 7,695,145 B2* | 4/2010 | Kojima et al. | 353/101 |
| 7,719,737 B2* | 5/2010 | Amada et al. | 359/196.1 |
| 7,993,005 B2* | 8/2011 | Peterson | 353/30 |
| 8,469,515 B2* | 6/2013 | Yamauchi et al. | 353/20 |
| 8,562,139 B2* | 10/2013 | Seki | 353/31 |
| 2004/0227806 A1* | 11/2004 | Takakubo | 347/241 |
| 2013/0162955 A1* | 6/2013 | Okamoto et al. | 353/30 |
| 2013/0335710 A1* | 12/2013 | Okamoto et al. | 353/30 |

FOREIGN PATENT DOCUMENTS

| | | |
|---|---|---|
| JP | 2001-142141 A | 5/2001 |
| JP | 2004-252112 A | 9/2004 |

* cited by examiner

FIG. 9
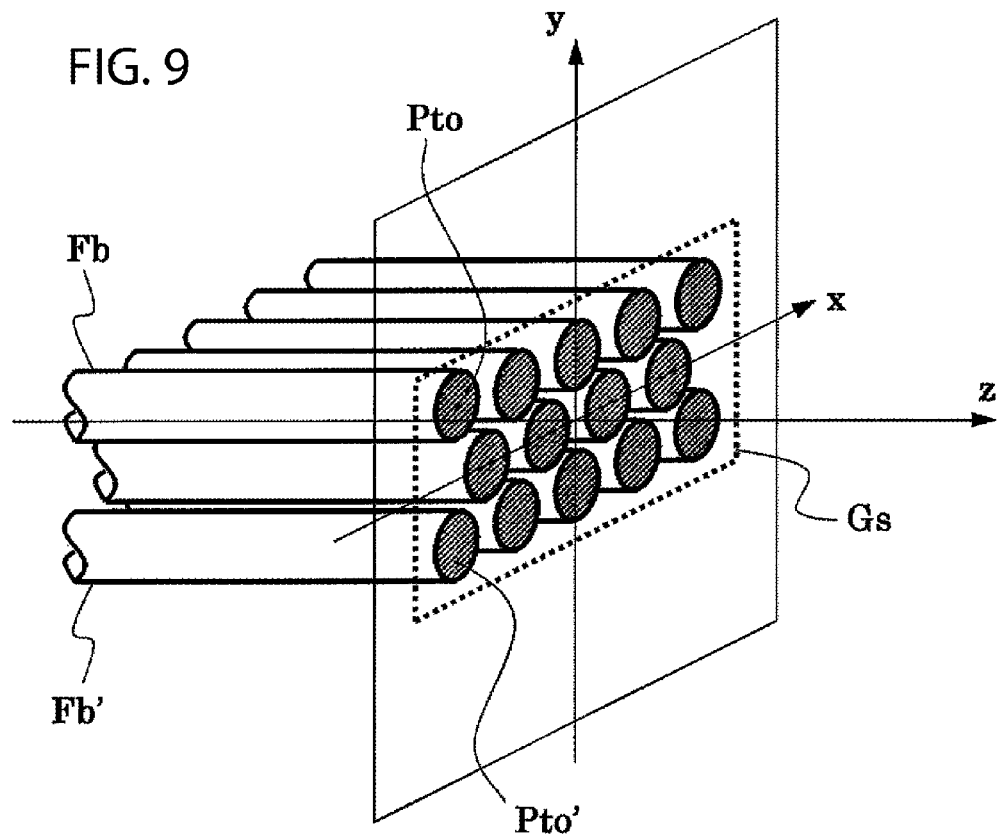
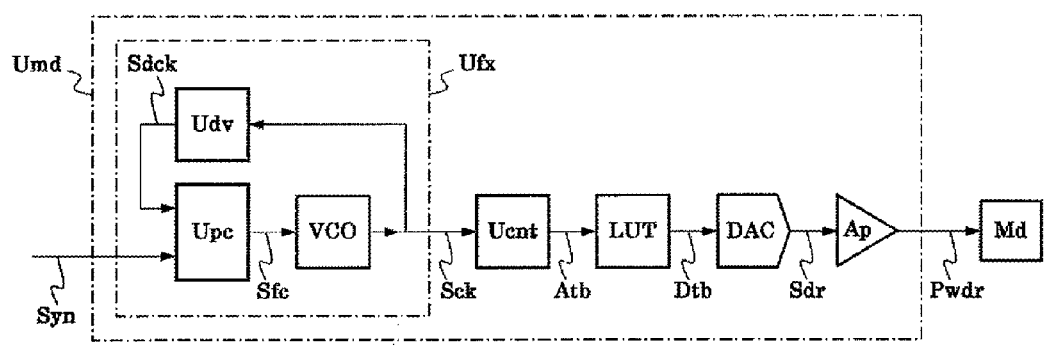
FIG. 10

FIG. 16
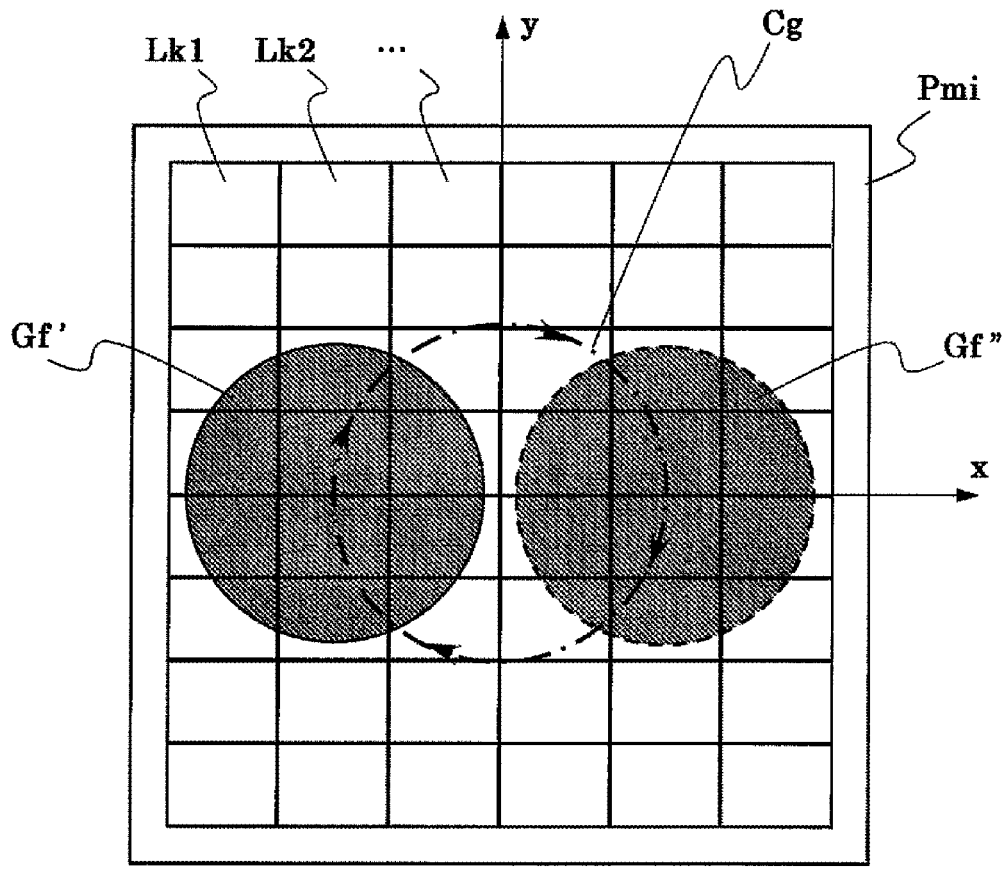
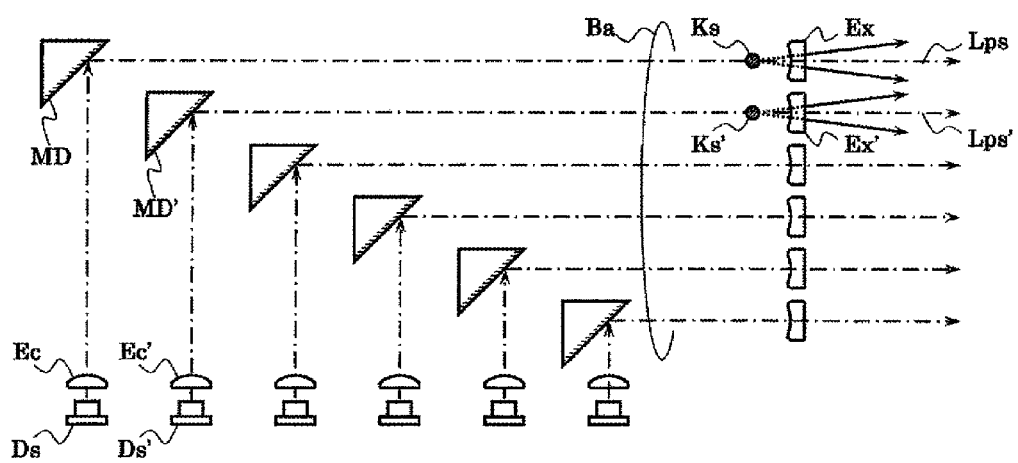
FIG. 17

LIGHT SOURCE APPARATUS AND PROJECTOR

CROSS-REFERENCES TO RELATED APPLICATION

This application claims priority from Japanese Patent Application Serial No. 2012-135397 filed Jun. 15, 2012, the contents of which are incorporated herein by reference in its entirety.

TECHNICAL FIELD

The present invention relates to a projector and a light source apparatus, which can be used for an optical device such as a projector, and which uses a coherent light source such as laser.

BACKGROUND

For example, a high intensity discharge lamp (HID lamp) such as a xenon lamp and an extra-high pressure mercury lamp has been used so far, in a projector for image display such as a DLP™ projector and a liquid crystal projector, and a photo mask exposure apparatus. As an example, the principle of such a projector is shown in FIG. 21 (reference: Japanese Patent Application Publication No. 2004-252112 etc.).

As described above, light from a light source (SjA), which is made up of a high intensity discharge lamp etc., is inputted into an incident end (PmiA) of a light uniformizing unit (FmA) by, for example, using a condensing unit (not shown), which is made up of a concave reflection mirror, a lens, etc., and is outputted from an emission end (PmoA) thereof. Here, for example, an optical guide can be used as the light uniformizing unit (FmA), which is also called a rod integrator, a light tunnel, etc., and is formed of a prism made from light transmissive material such as glass, resin, etc., wherein while the light inputted into the incident end (PmiA) is repeatedly and totally reflected on side faces of the light uniformizing unit (FmA) according to the principle, which is the same as that of an optical fiber, it propagates inside the light uniformizing unit (FmA), thereby functioning so that the illuminance on the emission end (PmoA) is sufficiently uniformized even if distribution of the light inputted into the incident end (PmiA) has unevenness.

With respect to an optical guide described above, in addition to the optical guide which is a prism shape and is made from light transmissive material such as glass, resin, etc. there is another type of optical guide, which is a hollow prism shape wherein the inside thereof is made up of a reflecting mirror, and light propagates, repeating a reflection thereinside in a similar manner thereby achieving the same function.

An illumination lens (Ej1A) is arranged so that a quadrangle image of the emission end (PmoA) is formed on a two-dimensional light amplitude modulation element (DmjA), whereby the two-dimensional light amplitude modulation element (DmjA) is illuminated by light outputted from the emission end (PmoA). However, in FIG. 21, a mirror (MjA) is arranged between the illumination lens (Ej1A) and the two-dimensional light amplitude modulation element (DmjA). And the two-dimensional light amplitude modulation element (DmjA) modulates light on a pixel to pixel basis according to an image signal so that the light is directed so as to enter the projection lens (Ej2A), or light is directed so as not to enter there, whereby an image is displayed on a screen (Tj).

Since the above-described two-dimensional light amplitude modulation element is also called a light valve, and in the case of the optical system shown in FIG. 21, a DMD™ (Digital Micromirror Device) is generally used as the two-dimensional light amplitude modulation element (DmjA).

The so-called fly eye integrator may be used as the light uniformizing unit, instead of the above-described optical guide. FIG. 22 shows the principle of a projector using this light uniformizing unit, as an example (reference: Japanese Patent Application Publication No. 2001-142141 etc.).

Light from a light source (SjB), which is made up of a high intensity discharge lamp etc., is inputted, as approximately parallel light flux, into an incident end (PmiB) of a light uniformizing unit (FmB) which is made up of a fly eye integrator, by using a collimator unit (not shown), which consists of a concave reflection mirror, a lens, etc. and is outputted from an emission end (PmoB). Here, the light uniformizing unit (FmB) is made up of a combination of an upstream fly eye lens (F1B) on an incident side, a downstream fly eye lens (F2B) on a light emission side, and an illumination lens (Ej1B). The upstream fly eye lens (F1B) and the downstream fly eye lens (F2B) are respectively formed by arranging, in vertical and horizontal directions, many quadrangle lenses whose focal distance is the same as one another and whose shape is the same as one another.

Each lens of the upstream fly eye lens (F1B), and each corresponding lens of the downstream fly eye lens (F2B), which is located downstream of each lens of the upstream fly eye lens (F1B), form an optical system called Koehler illumination, so that many Koehler illumination optical systems are aligned in a matrix in a plane. Generally, such a Koehler illumination optical system is made up of two lenses, wherein when the upstream fly eye lens collects light and illuminates an object face (a face to be illuminated), the upstream lens does not form an image of a light source on the object face, but forms an image of the light source on a center face of the downstream lens, whereby the object face is uniformly illuminated by arranging the downstream lens so as to form a quadrangle contour image of the upstream lens on the object face. The downstream lens functions so as to prevent a phenomenon in which an illuminance of a circumference part of the quadrangle object face falls depending on the size, if the downstream lens is not provided and a light source is not a perfect point light source but has a limited size, whereby it is possible to form a uniform illuminance on even the circumference part of the quadrangle object face by the downstream lens, independent of the size of the light source.

Here, since the optical system shown in FIG. 22 is configured based on case where approximately parallel light flux is inputted into the light uniformizing unit (FmB), an interval between the upstream fly eye lens (F1B) and the downstream fly eye lens (F2B) is set so as to become equal to those focal distances, so that an image of the object face of the uniform illumination of a Koehler illumination optical system is formed at infinity. However, since an illumination lens (Ej1B) is arranged downstream of the downstream fly eye lens (F2B), the object face can be pulled near on the focal plane of the illumination lens (Ej1B) from the infinity. Since the Koehler illumination optical systems arranged in a matrix in a plane are parallel to an incident light axis (ZiB) and light flux is approximately axisymmetrically inputted therein with respect to each central axis so that the output light flux is also approximately axisymmetrical, and the outputs of all the Koehler illumination optical systems are imaged on the same object face on the focal plane of the illumination lens (Ej1B) because of the nature of lens, i.e., a Fourier transform of a lens, in which light rays entering a lens face at the same angle as one another, are refracted so as to be directed to the same point on a focal plane without depending on the incidence position on the lens face.

As a result, all the illuminance distributions in lens faces of the upstream fly eye lens (F1B) are overlaid, so that one synthesized quadrangle image, whose illuminance distribution is more uniform than that in case of one Koehler illumination optical system, is formed on the incident light axis (ZiB). The two-dimensional light amplitude modulation element (DmjB), which is an illumination object, is illuminated by light outputted from the emission end (PmoB) when a two-dimensional light amplitude modulation element (DmjB) is arranged at a position of the synthesized quadrangle image. However, a polarization beam splitter (MjB) is arranged between the illumination lens (Ej1B) and the two-dimensional light amplitude modulation element (DmjB) so that the light is reflected towards the two-dimensional light amplitude modulation element (DmjB) when the light is illuminated. And the two-dimensional light amplitude modulation element (DmjB) performs a modulation and reflection so as to or so as not to rotate the polarization direction of the light by 90 degrees on a pixel to pixel basis according to an image signal, whereby only the rotated light passes through the polarization beam splitter (MjB), and enters the projection lens (Ej3B), so that an image may be displayed on a screen (Tj).

In addition, in the case of the optical system shown in FIG. 22, in general, a LCOS™ (Liquid Crystal on Silicon) is used as the two-dimensional light amplitude modulation element (DmjA) in many cases. In the case of such a liquid crystal device, since only a component of light in a specified polarization direction cannot be modulated effectively, although a component parallel to the specified polarization direction is usually passed therethrough as it is, only a component perpendicular to the specified polarization direction is rotated by 90 degrees with respect to the polarization direction, so that the polarized-light alignment functional device (PcB) for making all the light effectively usable is inserted, for example, downstream of the downstream fly eye lens (F2B). Moreover, a field lens (Ej2B) is inserted immediately upstream of the two-dimensional light amplitude modulation element (DmjB) so that approximately parallel light may enter the two-dimensional light amplitude modulation element (DmjB).

In addition to the reflection type of the two-dimensional light amplitude modulation element shown in FIG. 22, a transmissive liquid crystal device (LCD) may be used as the two-dimensional light amplitude modulation element in the optical arrangement which is suitable therefor (reference: Japanese Patent Application Publication No. H10-133303 etc.).

Generally, for example, a dynamic color filter such as a color wheel is arranged upstream or downstream of the light uniformizing unit in a projector in order to display a color image, and the two-dimensional light amplitude modulation element is illuminated with color sequential light flux of R, G and B (Red, Green, Blue), whereby color display is realized in time dividing manner, or a dichroic mirror or a dichroic prism is arranged downstream of the light uniformizing unit, so that the two-dimensional light amplitude modulation element, which is independently provided in each color, is illuminated with light which is separated into the three primary colors of R, G and B, and a dichroic mirror or a dichroic prism for performing color synthesis of the modulated light flux of the primary colors R, G and B is arranged. However, for ease of explanation, in FIGS. 17, 18A and 18B, these elements are omitted.

However, the high intensity discharge lamp has drawbacks such as low conversion efficiency from applied power to light power, i.e., great calorific, and a short life span. A solid light source such as an LED and a semiconductor laser attracts attention in recent years as an alternative light source, in which these drawbacks are solved. Although of these light sources, calorific loss of the LED is smaller and an operating life span thereof is longer than those of the discharge lamps, since there is no directivity of light emitted therefrom as in the discharge lamps, there is a problem that the usage efficiency of light is low when it is used in the above-mentioned projector or exposure apparatus, in which only light in specific direction can be used.

On the other hand, since a semiconductor laser has high directivity in addition to a small calorific loss and a long operating life spam as in such an LED, while there is an advantage that the usage efficiency of light is high, when it is used in the above-mentioned projector, exposure apparatus, etc. in which only light in a specific direction can be used, there is a problem that a speckle occurs. Here, the "speckle" means a granular/patchy pattern, which inevitably appears when projecting light of a semiconductor laser or another type of laser, or coherent light which is generated by performing wavelength conversion of laser light (by using nonlinear optical phenomena, such as a harmonic generation and an optical parametric effect). However, where it is used for generation of a viewing image in, for example, a projector, and for precise exposure of a photomask pattern on a film which is made from photosensitive material, there is a very troublesome phenomenon in which the quality of image is remarkably degraded, so that many devices for an improvement thereof have been proposed for many years.

For example, Japanese Patent Application Publication No. S59-024823 teaches an influence elimination apparatus of speckle of an output light of an optical fiber, in which an optical element for changing the relative relation between an input end face of the optical fiber and a laser optical beam in terms of time, is inserted inside an optical path of the optical fiber whose input end face receives a laser beam which is formed by condensing laser light. The patent application publication teaches, as an example, one form of changing the relative relation between the input end face of the optical fiber and the laser optical beam in terms of time, in which the position of a spot on the input end face of the optical fiber, at which the laser optical beam is condensed, is changed within a predetermined range in a vibrating manner, wherein an optical system configuration, using an ultrasonic diffraction element, a deflecting mirror (galvanometer), an oscillating mirror, and a rotation non-parallel glass plate is given as embodiments.

The patent application publication teaches, as an example, one form of changing the relative relation between the input end face of the optical fiber and the laser optical beam in terms of time, wherein although the position of a spot on the input end face of an optical fiber, at which the laser optical beam is condensed, is not changed, the angle of the central axis of the condensing laser optical beam is changed within a predetermined range in a vibrating manner. However, no concrete optical system configuration has been proposed.

On the other hand, in case where a periodic perturbation is added to a dynamic mechanism, specifically a route of an a propagation path of light in an optical system or a light path length in the propagation path, thereby periodically changing the phase distribution of the light on a face to be irradiated, if an element, which performs periodic operation, is contained in the structure of the apparatus using an illumination light, for example, a beat phenomenon arises due to an interference of periodicity of both, that is, frequency difference of both in an periodic operation, so that there is possibility that light having frequency, at which man can view it, changes.

For example, in the case of the projector shown in FIGS. 21 and 22, since in an operation of the two-dimensional light amplitude modulation element (DmjA) or the two-dimensional light amplitude modulation element (DmjB), not only a component of spatial modulation but also periodic modulation, namely, a component of a time-periodic modulation in a segment of time, is contained, if, as described above, a light source, which is configured so that a periodic perturbation is added to a route of a propagation path of light or the light path length in the propagation path, is used, a flicker etc. may occur in the whole image to be displayed or a specific hue or specific brightness. However, no solution has been proposed to solve this problem.

SUMMARY

It is an object of the present invention is to offer a coherent light source apparatus and a projector which solves the problem that the uniformity of light to be projected is deteriorated due to a speckle, which inevitably appears when projecting light of a semiconductor laser or another type of laser, or coherent light which is generated by performing wavelength conversion of laser light, while avoiding side effects such as a flicker etc., which may appear due to an interference with a time-periodic modulation.

The present coherent light source apparatus according to a first aspect of the present invention comprises a first optical system (Eu) has a first light emission region (Gs) formed by a coherent light source (Sc), and which projects light from the first light emission region (Gs) so as to form a second light emission region (Gu), a light deflection unit (Md) which deflects light flux (Bu) in connection with formation of the second light emission region (Gu) near the second light emission region (Gu), a second optical system (Ef), which is provided in a downstream side of the light deflection unit (Md), and which forms a third light emission region (Gf) in response to the light flux (Bu), which has been deflected by the light deflection unit (Md), a light mixing unit (Fm) for mixing a component of an incident light angle and that of a position thereof, which is provided on a downstream side of the second optical system (Ef), and which has an incident end (Pmi) near the third light emission region (Gf), and a light deflection unit drive circuit (Umd) for receiving a periodic optical deflection synchronization signal (Syn) inputted from the outside, thereby driving the light deflection unit (Md), wherein the light deflection unit (Md) operates so as to continuously change a direction in which the light flux (Bu) is deflected while synchronizing with the optical deflection synchronization signal (Syn).

According to a second embodiment of the present invention, the light mixing unit (Fm) of the coherent light source apparatus is an optical guide in which light is confined in a predetermined space and the light is repeatedly reflected therein so as to be guided.

According to a third embodiment of the present invention, the light mixing unit (Fm) of the coherent light source apparatus is a fly eye integrator.

According to a fourth embodiment of the present invention, the second optical system (Ef) generates the third light emission region (Gf) which is conjugate to the second light emission region (Gu).

According to a fifth embodiment of the present invention, the second optical system (Ef) of the coherent light source apparatus generates, at a distance, an image, which is conjugate to the first light emission region (Gs), and generates a third light emission region (Gf), which is approximately conjugate to an exit pupil (Quo) of the first optical system (Eu), the third light emission region (Gf) is continuously moved on the incident end (Pmi) by an operation of the light deflection unit (Md).

According to a sixth embodiment of the present invention, the first light emission region (Gs) in the coherent light source apparatus is formed on an emission end (Pto) of the optical fiber (Fb) where light of a coherent light source (Sc) is inputted from an incident end.

According to a seventh embodiment of the present invention, in a coherent light source apparatus, the light deflection unit (Md) rotates an optical element for a deflection by a rotary motor (Mdd), and the rotary motor (Mdd) includes a rotation sensor (Enr) which generates a rotation detection signal (Sen) at every predetermined rotation angle. The light deflection unit drive circuit (Umd) includes a rotation detection signal frequency demultiplier (Uen) which turns the rotation detection signal (Sen) into a dividing rotation detection signal (Sden) which is divided by a natural number N (an Nth part of the detection signal (Sen)), and a phase comparison drive control circuit (Upc) which adjusts drive capability by comparing a phase of the optical deflection synchronization signal (Syn) with that of the dividing rotation detection signal (Sden), so as to increase the number of rotations of the rotary motor (Mdd) when the phase of the dividing rotation detection signal (Sden) is retarded from the optical deflection synchronization signal (Syn), and so as to decrease the number of rotations of the rotary motor (Mdd) may when it is advanced, wherein the rotary motor (Mdd) is rotated by a phase-locked loop in synchronization with the optical deflection synchronization signal (Syn).

According to an eighth embodiment of the present invention, the light deflection unit drive circuit (Umd) of the coherent light source apparatus has a frequency demultiplier condition setting interface (Uif), wherein a dividing ratio Nd for dividing the rotation detection signal (Sen) by the natural number is set up from the outside thereof through the frequency demultiplier condition setting interface (Uif).

A projector according to a ninth embodiment of the present invention displays an image by using the above coherent light source apparatus, wherein while a light uniformizing unit serves as the light mixing unit (Fm), an image signal generation circuit (Ur) which controls a two-dimensional light amplitude modulation element (Dmj) generates the optical deflection synchronization signal (Syn).

According to the embodiments of the present invention, it is possible to offer a coherent light source apparatus and a projector capable of solving the problem that the uniformity of light to be projected is deteriorated due to a speckle, which inevitably appears when projecting light of a semiconductor laser or another type of laser, or coherent light which is generated by performing wavelength conversion of laser light, while avoiding side effects such as a flicker etc., which may appear due to an interference with a time-periodic modulation.

BRIEF DESCRIPTION OF THE DRAWING

Other features and advantages of the present LIGHT SOURCE APPARATUS AND PROJECTOR will be apparent from the ensuing description, taken in conjunction with the accompanying drawings, in which:

FIG. 9 is a simplified and conceptual diagram showing part of a coherent light source apparatus according to an embodiment of the present invention;

FIG. 10 is a simplified block diagram showing part of a coherent light source apparatus according to an embodiment of the present invention;

FIG. 16 is a simplified diagram showing an aspect of a coherent light source apparatus according to an embodiment of the present invention;

FIG. 17 is a simplified and conceptual diagram showing an aspect of part of a coherent light source apparatus according to an embodiment of the present invention;

DESCRIPTION OF EMBODIMENTS

Figure 1:
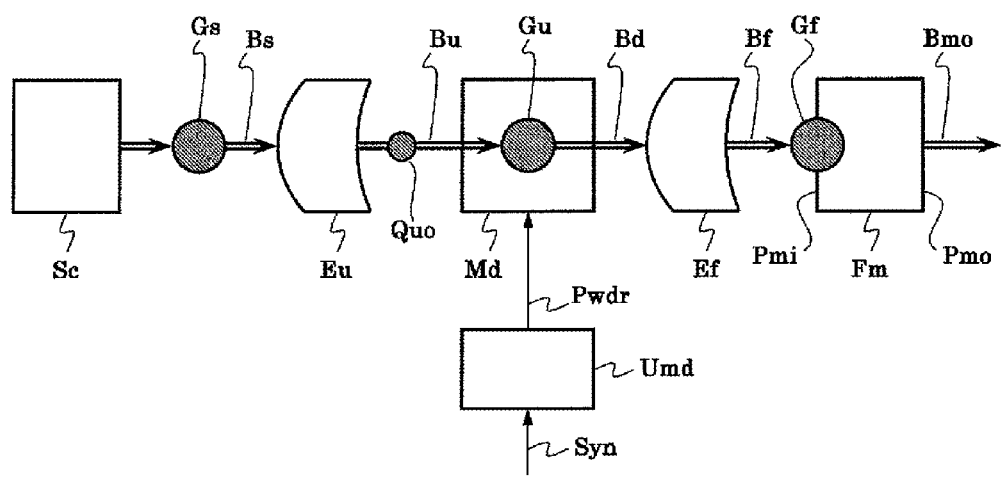
FIG. 1 is a simplified block diagram showing a coherent light source apparatus according to an embodiment of the present invention.

A term "conjugate" in an explanation of the present invention is used as a general term in the geometric optics field, and, for example, "when A and B are conjugate to each other", it means that A is imaged on B or B is imaged on A, by an action of an optical element such as a lens having an image formation function, based on at least the paraxial theory. Here, A and B are images and include, as objects, not only an isolated point image but also a set of a plurality of point images or a spread image made up of continuously distributed point images.

Here terms "point image" or "image point (that is, "image")" is used as a general term in the geometric optics field, and includes any one of the following cases: where light is actually emitted from the point; where when light converges toward the point and when a screen is placed, a bright point is reflected; where light is viewed so that light converges toward the point (however, the point is located inside an optical system, so that a screen cannot be placed therein); and where light is viewed so that light is emitted from the point (however, the point is located inside an optical system, so that a screen cannot be placed therein) and they are not distinguished from one another.

Even if a formed image accompanies a phenomenon where even if it is a condition on which a point image should be produced in view of a geometrical-optical design, actually not such a point image is formed by a diffraction phenomenon but a condensing region spreading in a certain area is formed, a phenomenon where blurring arises due to an aberration and focus adjustment error in image formation or a defect of an optical element such as a lens, and assembly errors, etc., so that a condensing region spreading in an area larger than the limit of a condensing region produced due to a diffraction phenomenon is merely formed, and/or a phenomenon where the position of the image point is shifted from an ideal position in the design due to assembly adjustment errors of an optical system, etc., as long as the generated output image can be effectively used, it is possible to disregard these phenomena, if the generated output image is efficiently used in a host apparatus such as a projector in which output light from the present coherent light source apparatus is used.

Moreover, a term "light emission region" includes the following cases: where the above-mentioned image may be included in a space or on a face which emits light or is irradiated with light, and similarly, where light is actually emitted from the region, where a bright region is reflected when light converges toward that region and a screen is placed, where light is viewed so that light converges toward the region (however, the region is located inside an optical system, so that a screen cannot be placed therein), and where light is viewed so that light is emitted from the region (however, the region is located inside an optical system, so that a screen cannot be place therein) and they are not distinguished from one another. Furthermore, a term "radiant point" means an image point, which forms a light emission region or a small light emission region which can be substantially converged to approximately the diffraction limit.

First, an embodiment of the present invention will be explained, referring to FIG. 1. FIG. 1 is a simplified block diagram, showing a coherent light source apparatus according to the embodiment of the present invention. For example, when a coherent light source (Sc) shown in FIG. 1 is a semiconductor laser, a radiant section of diverging light, which exists on a surface of a semiconductor chip accommodated inside the semiconductor laser package, can be substantially treated as a point light source, so that this can be used as a first light emission region (Gs).

A first optical system (Eu), which is made up of a lens etc., receives as an input light flux (Bs) from the first light emission region (Gs), and is arranged so that a second light emission region (Gu) may be formed near a deflection point (polarization point) of a downstream light deflection unit (Md) as a projection region with respect to the first light emission region (Gs). That is, the light deflection unit (Md) deflects (polarizes) the light flux (Bu) involved in formation of the second light emission region (Gu), at the deflection point near the second light emission region (Gu).

A second optical system (Ef), which is made up of a lens etc., is arranged so as to receive as an input the light flux (Bd) deflected by the light deflection unit (Md), and to form a third light emission region (Gf), near an incident end (Pmi) of a downstream light mixing unit (Fm).

The light flux (Bf) from the second optical system (Ef) is inputted into the light mixing unit (Fm) through the incident end (Pmi), wherein angle and position components of the incident light are mixed inside the light mixing unit (Fm), and light flux (Bmo) is outputted from an emission end (Pmo) thereof. As a result of multiple interferences caused by mixture of the angle and position components of the incident light, a spotty or patchy pattern of a speckle projected on an illumination face, becomes fine, so that a characteristic in which it becomes difficult to be seen, is given to the outputted light flux (Bmo).

Since the mixture state of the angle and position components of the incident light on the incident end (Pmi) is continuously changed, by performing an operation of the light deflection unit (Md), in which the deflection direction of the light flux (Bu) is continuously changed, a speckle may always move in the light flux (Bmo) emitted from the emission end (Pmo) of the light mixing unit (Fm). Therefore, if it is averaged within a suitable period corresponding to the movement speed, the above-mentioned spotty or patchy pattern of the speckle becomes fine, so that the speckle becomes invisible, synergistically working with the effect that it becomes difficult to be viewed.

Here, a light deflection unit drive circuit (Umd) is capable of driving the light deflection unit (Md) so as to operate in synchronization with the optical deflection synchronization signal (Syn), which is received from the outside, in order that the direction of deflection (polarization) of the light flux (Bu) is continuously changed by driving the light deflection unit (Md). Therefore, in a host apparatus, i.e., an apparatus using the coherent light source apparatus according to the embodiment of the present invention, when a time-periodic modulation is added (performed) to the output light from the coherent light source apparatus according to the embodiment of the present invention, the host apparatus may generate the optical deflection synchronization signal (Syn) in synchronization with the time-periodic modulation to be added, and input it into the light deflection unit drive circuit (Umd) of the coherent light source apparatus according to the embodiment of the present invention.

As a result, since a fluctuation component, which is contained in the output light from the coherent light source apparatus according to the embodiment of the present invention, and which results from the dynamic behavior of the light deflection unit (Md), is synchronized with the optical deflection synchronization signal (Syn) by the action of the light deflection unit drive circuit (Umd), in the host apparatus, it is possible to prevent side effects such as a viewable flicker due to interference of this fluctuation component and the time-periodic modulation added to the output light from the coherent light source apparatus according to the embodiment of the present invention.

Various devices can be used as the light mixing unit (Fm), as long as an angle component of incident light and a position component thereof are mixed so as to be emitted after the light enters there. As a specifically simple example, an optical guide, which guides waves while confining light in a predetermined space and carrying out multiple reflection of the light, can be used.

Figure 21:
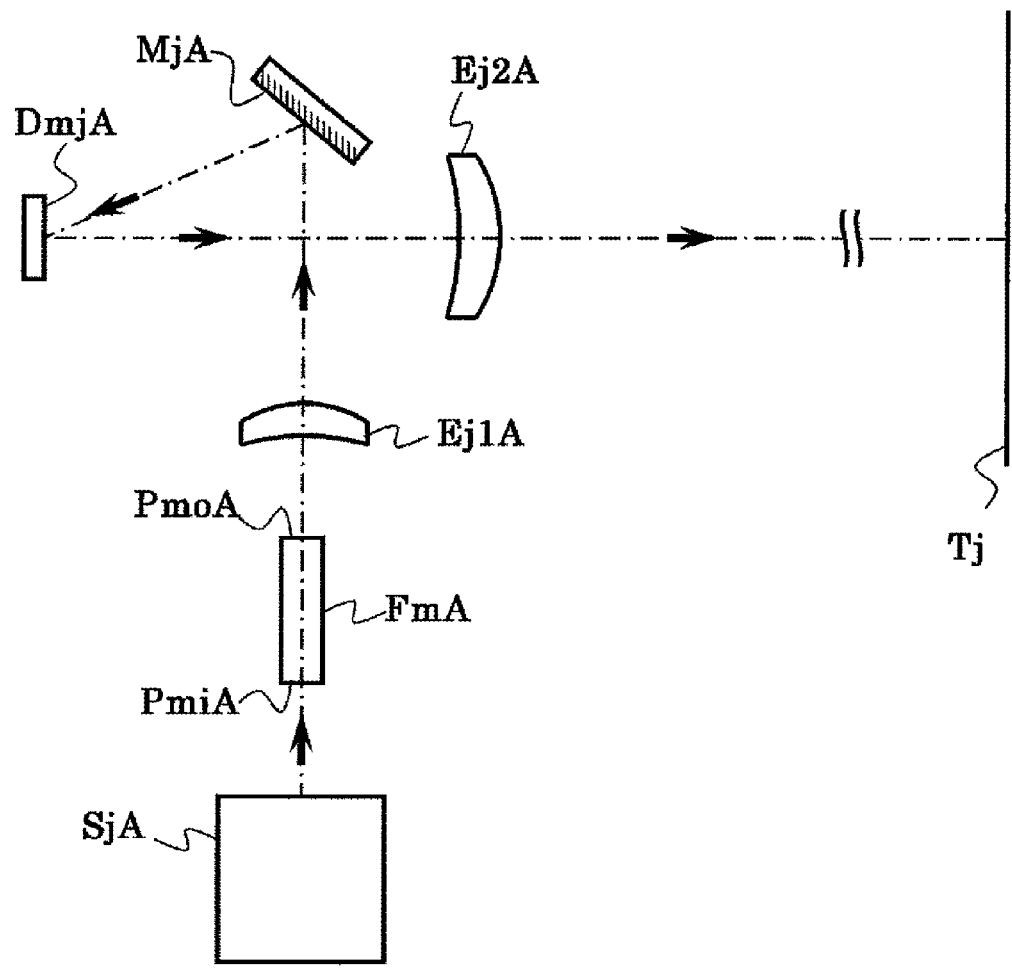
FIG. 21 is a principle diagram for explaining an aspect of part of a kind of a conventional projector, which relates to a projector according to the present invention.

As shown in FIG. 21, this is also called a rod integrator, a light tunnel, etc., and is formed of a prism, which is made from light transmissive material such as glass, resin, etc., wherein while the light inputted into the incident end (Pmi) is repeatedly and totally reflected on a side face of the light uniformizing unit (Fm) according to the principle, which is the same as that of an optical fiber, it propagates inside the light uniformizing unit (Fm), so that the components of angle and position of the incident light may be mixed with each other. As described above, although the optical guide is formed by a prism, which is made from light transmissive material such as glass, resin, etc., it may be formed of a hollow prism in which the inside thereof is formed of a reflection mirror, and while a reflection of light is repeated on an inner face similarly, the light propagates therein so that a similar function thereto is achieved.

The reason why the angle and position components of incident light are mixed by guiding waves while confining the light in a predetermined space and carrying out multiple reflection of the light in this way, is that when multiple reflection is repeated and light propagates over the full length of the light mixing unit (Fm), very many wave sources must be viewed according to the principle of a kaleidoscope if it is viewed from the emission end (Pmo), so that it becomes equivalent to a state in which the light from the very many wave sources reaches the emission end (Pmo) and is emitted therefrom.

Figure 22:
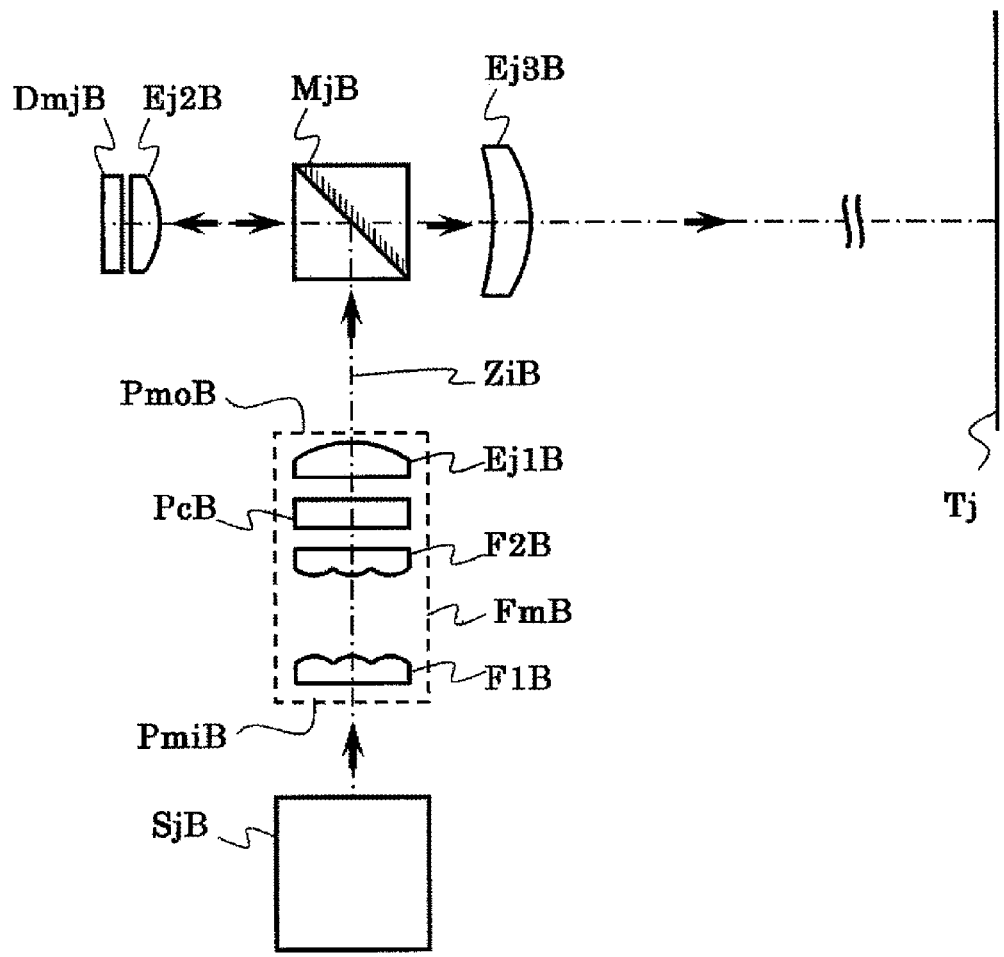
FIG. 22 is a principle diagram for explaining an aspect of part of a kind of a conventional projector, which relates to a projector according to the present invention.

Furthermore, a fly eye integrator similar to one, which is previously described with respect to FIG. 22, can be used as the light mixing unit (Fm). The reason why the angle and position components of the incident light is mixed by using such a fly eye integrator, is that as described above in the fly eye integrator, since all the quadrangle contour images of the respective lenses aligned in vertical and horizontal directions on the fly eye lens, which is on an incident side, are overlaid at one place, a kaleidoscope-like state appears as in the case of the above-mentioned optical guide, so that the light from very many wave sources reaches an object to be illuminated, simultaneously.

As one of the embodiments of the present coherent light source apparatus, when the second optical system (Ef) receives as an input the light flux (Bd) deflected by the light deflection unit (Md) and a third light emission region (Gf) is formed near the incident end (Pmi) of the latter light mixing unit (Fm), it is suitable to generate the third light emission region (Gf) which is conjugate to the second light emission region (Gu). However, as described above, what is meant by the second light emission region (Gu) and the third light emission region (Gf) being conjugate to each other, is that the third light emission region (Gf) is formed as an output image by an image formation function of the second optical system (Ef), whose input image is an image of the second light emission region (Gu).

The second light emission region (Gu) formed by the light flux (Bu) outputted from the optical system, which is arranged upstream of the light deflection unit (Md), is not movable independently of the deflection (polarization) operation of the light deflection unit (Md). In addition, since the second light emission region (Gu) is located near the deflection point of the light deflection unit (Md), the light emission region, which is the origination of the light flux (Bd) deflected by the light deflection unit (Md), also hardly moves. And since the second light emission region (Gu) and the third light emission region (Gf) are conjugate to each other, the third light emission region (Gf) remains almost unmovable, whereby even if the deflection operation of the light deflection unit (Md) is performed, the state, where the light flux (Bf) enters the incident end (Pmi) of the light mixing unit (Fm), is always maintained.

Figure 2:
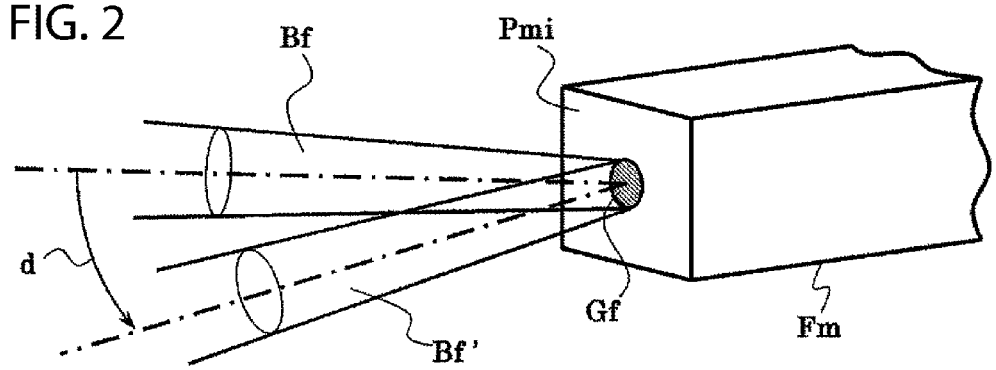
FIG. 2 is a simplified and schematic diagram showing part of a coherent light source apparatus according to an embodiment of the present invention.

FIG. 2 is a pattern diagram showing such a state. The figure shows a state where even if the light flux (Bf) turns into light flux (Bf') by the deflection operation shown by an arrow (d), the third light emission region (Gf) on the incident end (Pmi) of the light mixing unit (Fm) remains unmovable.

Therefore, under the conditions where light can propagate inside the light mixing unit (Fm), which are determined depending on the structure of the light mixing unit (Fm), the amount of the light flux (Bmo) emitted from an emission end (Pmo) of the light mixing unit (Fm) can be made so as not to depend on the deflection angle of the light deflection unit (Md), that is, so that brightness can be made constant, by setting the deflection angle range of the light deflection unit (Md) to a suitable value so that light rays, which deviate and exceed these conditions depending on the deflection angle, may not be generated more than a tolerance limit.

In addition, a degree of immovability at time when the light emission region, which is the origination of the light flux (Bd) deflected by the light deflection unit (Md) becomes unmovable, depends on an approximate degree at time when the second light emission region (Gu) is located near the deflection point of the light deflection unit (Md). Moreover, a degree of immovability at time when the third light emission region (Gf) on the incident end (Pmi) of the light mixing unit (Fm) becomes almost unmovable, depends on both the degree of immovability at time when the light emission region, which is the origination of the light flux (Bd) deflected by the light deflection unit (Md) becomes almost unmovable, and the approximate degree at time when the third light emission region (Gf) is formed near the incident end (Pmi) of the light mixing unit (Fm), and furthermore, depends on the aberration of the second optical system (Ef). Since it partially goes out of the incident end (Pmi) when the degree of immovability of the third light emission region (Gf) is not good so that the usage efficiency of light decreases, it is necessary to make the degree of immovability into a range to the extent that this degradation of efficiency may not exceed permissible amount.

In addition, in the present coherent light source apparatus, in which the third light emission region (Gf) conjugate to the second light emission region (Gu) is formed, when such a fly eye integrator is used as the light mixing unit (Fm), it is desirable that the third light emission region (Gf), which is formed near the incident end (Pmi), be formed as an illumination region, which stretches out over the entire region of the incident end (Pmi). This is because when the third light emission region (Gf) enters only part of the fly eye lens of the incident end (Pmi), the number of the quadrangle lens contour images to be overlaid becomes small and an action of mixture of the angle and position components of incident light becomes weaker.

On the other hand, in the case where the above-mentioned optical guide is used as the light mixing unit (Fm), light may enter there, in a form of, for example, a point image, which is concentrated on one or more places of the incident end (Pmi), or two or more places. This is because the angle and position components of the incident light are fully mixed when light flux spreads while propagating in the optical guide and reaches the emission end (Pmo), if an image formation spread angle of the point image is suitable.

In the above illustrated case where the coherent light source (Sc) is a semiconductor laser, if the number of semiconductor lasers is one, the first light emission region (Gs) is considered as only one point light source, and usually, it is placed on the optical axis of the optical system, and is arranged so as to be directed so that the central ray of distribution of diffusing light in a diffusing direction from the semiconductor laser may be coincide with an optical axis. However, in case where two or more semiconductor lasers are provided or in case of a light source from which a radiant point is continuously distributed in a limited area, a design, in which an entrance pupil and an exit pupil of an optical system, and the principal ray are taken into consideration, is needed, and such a situation is described below.

Taking a general camera lens for an example, although an aperture stop usually exists inside a lens, an image of the aperture stop, which can be seen through the lens when seen from a side where light enters, is called an entrance pupil, and an image of the aperture stop, which can be seen through the lens when seen from a side where light is emitted, is called an exit pupil. In addition, a meridional ray, which goes toward the center of the entrance pupil or comes out from the center of an exit pupil, is called a principal ray. Moreover, rays other than the principal ray are in a broad sense called marginal rays. However, in an optical system for treating light, which has directivity as in the laser, no aperture stop is provided in many cases since there may be no necessity of extracting light flux by such an aperture stop. In such case, they are defined based on a form of light existence in an optical system.

Usually, when the central ray of the optical direction distribution in the radiation light flux from a radiant point is defined as a principal ray, an entrance pupil is located at the position where the principal ray, which enters an optical system, or an extension thereof, intersects with an optical axis, and an exit pupil is located at a position where the principal ray emitted from the optical system or an extension thereof intersects with the optical axis. However, in a precise sense, there may be cases where the principal ray defined in such a manner and the optical axis do not intersect with each other because of, for example, an adjustment error, so that they are merely at a skew position to each other. However since such a phenomenon is not related to the essence thereof, so that there is no point in discussion therefor, in an explanation set forth below, it is assumed that such a phenomenon does not occur, or they intersects with each other at a position where the principal ray and the optical axis are closest to each other. Moreover, where two adjoining partial optical systems A and B in the optical system are observed, when B adjoins A immediately downstream thereof, the exit pupil of A turns into an entrance pupil of B (similarly to the case where an output image of A turns into an input image of B), and all the entrance pupil and the exit pupil of the partial optical system, which are arbitrarily defined in the optical system, (if there is an aperture stop, it is an image thereof, and even though it does not exist, they) must be conjugate with each other, so if no distinction therebetween is specifically needed, the entrance pupil and the exit pupil will be merely called a pupil.

Although the optical axis of the optical system is called a z axis in the explanation and the drawing of the present invention, a direction, in which light rays propagating along the original z axis are reflected, is also called a z axis when the optical axis is bent by a reflection mirror, so that a new axis coordinates are not used. However, in the light deflection unit (Md), the center of distribution in a direction (a zf axis, which is described below) where the rays propagate along the z axis before it is deflected and propagates, is defined as a z axis after deflection. In addition, for convenience, in drawings such as FIG. 3, an x-axis or a y-axis, which is an axis perpendicular to the z axis, is shown.

An embodiment of the present invention will be explained below referring to FIGS. 3, 4, and 5, which are conceptual diagrams schematically showing part of a coherent light source apparatus according to an embodiment of the present invention. Specifically, FIG. 3 shows a situation where a first light emission region (Gs) is made up of a plurality of spreading radiant points (Ks, Ks', ... ).

When the radiant point (Ks) is observed, as shown by outermost circumferential marginal rays (Lms1, Lms2), light flux which forms the radiant points (Ks) in a cone angle region defined by a bottom face (Ci) is distributed, and the principal ray (Lps) of the light flux from this radiant point is defined as a central ray of this light flux distribution. As a generality, the principal rays (Lps, Lps', ... ) respectively have an angle with respect to the z axis which is an optical axis of an optical system, so that it is considered that a pupil exists at a point (Qs) where they intersect with the optical axis. In addition, when the principal rays (Lps, Lps', ... ) as shown in FIG. 4 are parallel to the optical axis of the optical system, it is considered that a pupil lies at infinity.

As one of the embodiments of the coherent light source apparatus according to the present invention, the first light emission region (Gs) is made up of a plurality of, or distributed radiant points (Ks, Ks', ... ), and the principal rays (Lps, Lps', ... ) of the light flux each of which forms a radiant point (Ks, Ks', ... ) of the first light emission region (Gs) are suitably set so as to be approximately parallel to one another after passing through the second optical system (Ef).

Figure 3:
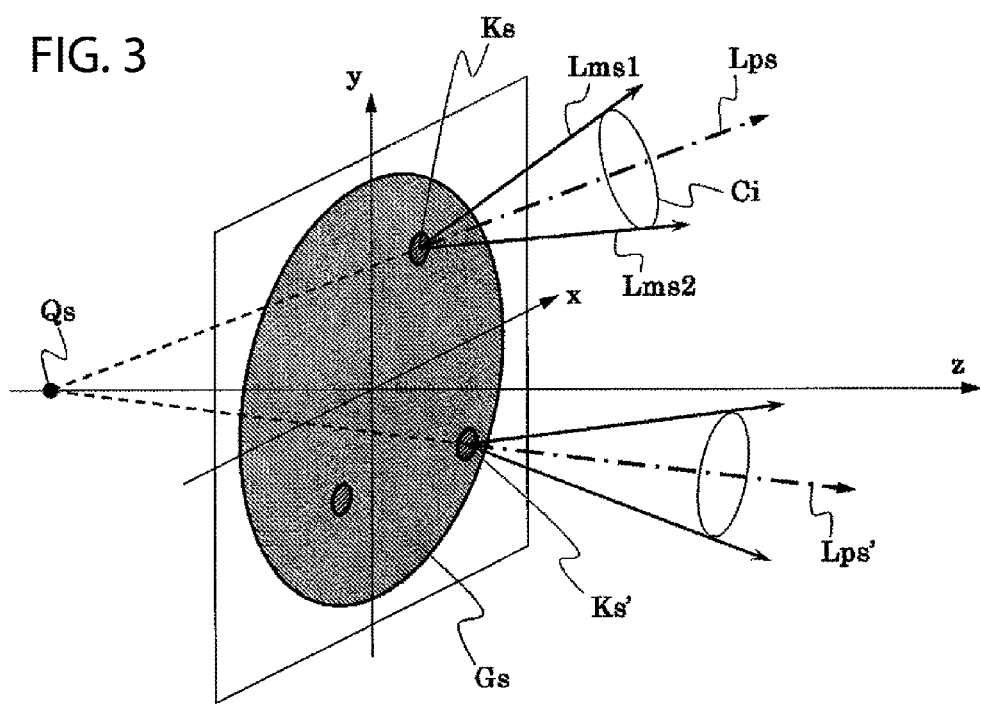
FIG. 3 is a simplified and conceptual diagram showing part of a coherent light source apparatus according to an embodiment of the present invention.
Figure 4:
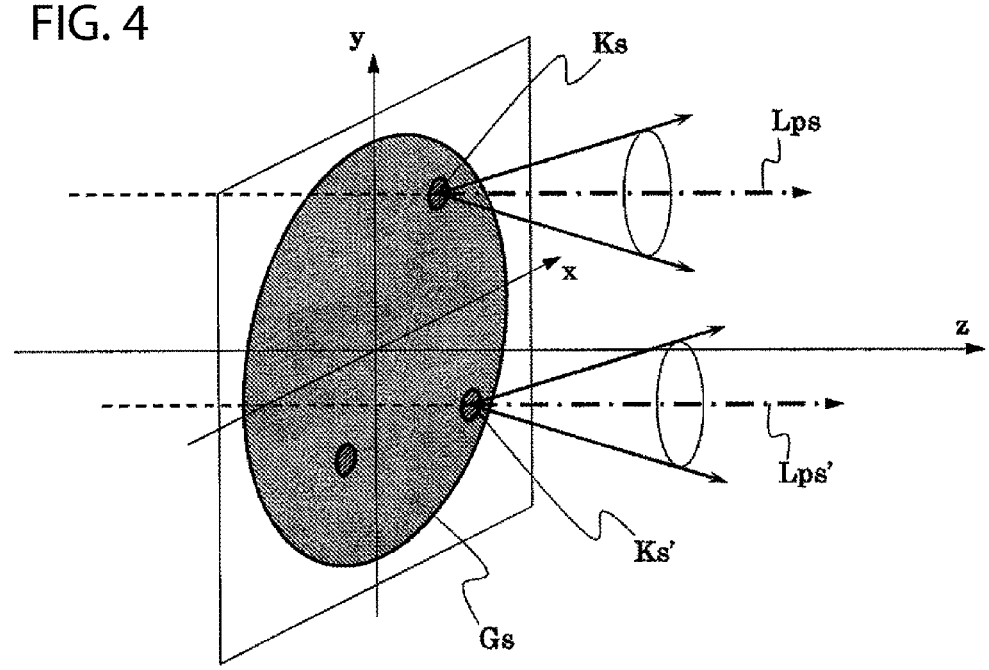
FIG. 4 is a simplified and conceptual diagram showing part of a coherent light source apparatus according to an embodiment of the present invention.
Figure 5:
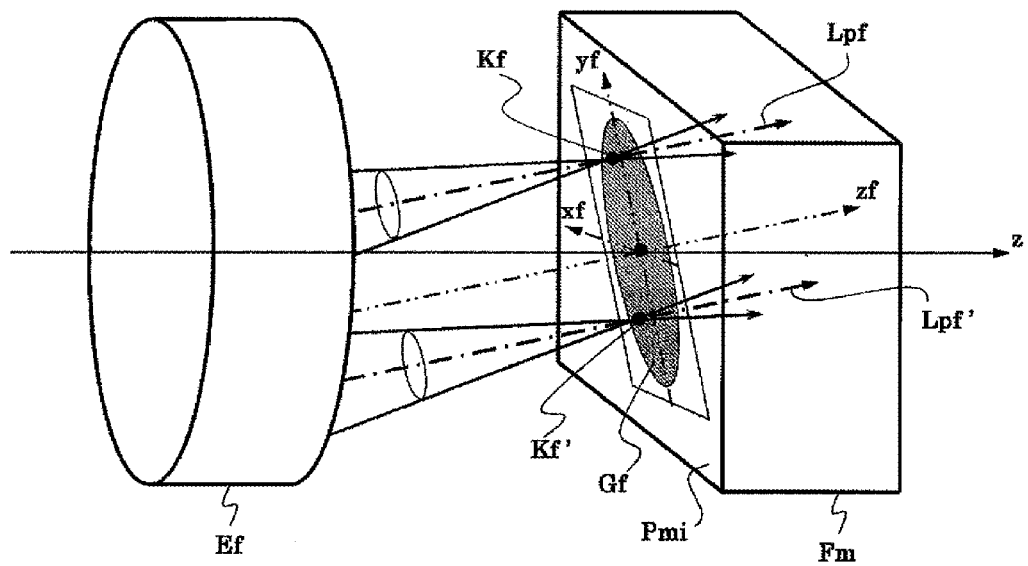
FIG. 5 is a simplified and conceptual diagram showing part of a coherent light source apparatus according to an embodiment of the present invention.

FIG. 5 shows a situation where when the light flux which forms the radiant points (Ks, Ks', ... ) of the first light emission region (Gs) enters the optical system, and passes through the second optical system (Ef) after passing through the first optical system (Eu) and the light deflection unit (Md), in the space of the first light emission region (Gs), for example, the principal rays (Lps, Lps', ... ) shown in FIG. 3 turn into the principal rays (Lpf, Lpf') which are approximately parallel to one another after passing through the second optical system (Ef). Although the optical axis of the optical system is the z axis, the principal rays (Lpf, Lpf') are not parallel to at the z axis, rather parallel to the zf axis. The z axis of the optical system, which is located upstream of the light deflection unit (Md), is given an inclination by the light deflection unit (Md), and is projected by the second optical system (Ef), thereby forming the zf axis.

The optical system, in which the principal rays (Lpf, Lpf') are approximately parallel to each other, can be realized by configuration in that an input side focal point of the second optical system (Ef) and an entrance pupil of the second optical system (Ef) are in agreement with each other. For that purpose, that when an image of the pupil in the space of the first light emission region (Gs) is projected by the first optical system (Eu) as an exit pupil, as described above, it may be designed so as to be in agreement with the input side focal point of the second optical system (Ef). In addition, it may be designed based on the case where a deflection angle of the light deflection unit (Md) is zero.

The second optical system (Ef) forms the third light emission region (Gf) near the incident end (Pmi) of the light mixing unit (Fm) as an image, which is conjugate to the second light emission region (Gu) projected based on the first light emission region (Gs) by the first optical system (Eu). At this time, although in general, the third light emission region (Gf) is not necessarily conjugate to the first light emission region (Gs), FIG. 5 shows that the third light emission region (Gf) is conjugate to the first light emission region (Gs). Therefore, the radiant points (Kf, Kf', ... ) which form the third light emission region (Gf) are conjugate to the radiant points (Ks, Ks', ... ). In addition, in order to realize this, the first optical system (Eu) may form the second light emission region (Gu) as an image, which is conjugate to the first light emission region (Gs).

Thus, it is preferable to make the principal rays (Lpf, Lpf') approximately parallel to one another after passing through the second optical system (Ef), especially in case where an optical guide is used as the light mixing unit (Fm). The reason therefor is set forth below.

Since light inputted into the incident end (Pmi) of the light mixing unit (Fm) propagates inside the light mixing unit (Fm) while repeating full reflection on a side face of the light mixing unit (Fm) according to the same principle as an optical fiber, there is a limit of an angle formed by the incident rays and the central axis of the light mixing unit (Fm) in case where the incident rays can propagate inside the light mixing unit (Fm) without a loss, so that if the light is incident thereon at an angle exceeding it, no total reflection occurs, whereby part of the light will deviate from the optical guide every time it reflects. Furthermore, for example, in an optical device such as a projector which is described referring to FIG. 21, other than the optical guide, that is, there are constrained conditions on an angle for effectively using light, that is, for example, a two-dimensional light amplitude modulation element (DmjA), a projection lens (Ej2A), etc. Therefore, it turns out that if there are rays exceeding the constrained angle $\Delta\Theta$ specified by the optical guide and an optical system on a downstream side thereof, among all the rays, before light flux enters an optical guide, it is advantageous to change them so as not to exceed it as much as possible.

As can be understood from FIG. 5, light flux which forms each of the radiant points (Kf, Kf', ... ) of the third light emission region (Gf) is surrounded by a marginal ray whose center is the principal ray (Lpf, Lpf'). As a generality, when an apex angle of each cone angle region where such marginal rays exist and are dispersed, is represented as $\Delta\theta m$ in common to all the radiant points (Kf, Kf', ... ), and an apex angle of the cone angle region about the distribution as to the principal rays (Lpf, Lpf', ... ) of all the radiant points (Kf, Kf', ... ), which are included in the third light emission region (Gf), is represented as $\Delta\theta p$ (however, $\Delta\theta p=0$ in the optical system shown in FIG. 5), an apex angle of the cone angle region as the whole light flux which forms the third light emission region (Gf) is $\Delta\theta m+\Delta\theta p$. An angle margin $\Delta\phi=\Delta\Theta-\Delta\theta m-\Delta\theta p$ with respect to the constrained angle $\Delta\Theta$ specified by the optical guide and the downstream optical system that this apex angle $\Delta\theta m+\Delta\theta p$ has, becomes a maximum value of a deflection angle which is allowed to the light deflection unit (Md).

In order to avoid a problem of deterioration of the uniformity of the projected light due to the speckle, which is solved by the present invention, it is clear that the larger a deflection angle that the light deflection unit (Md) has, the more advantageous it is. However, $\Delta\theta m$ is subject to given conditions $\Delta\Theta$, or constrained conditions resulting from the energy conservation theorem, that is, constrained conditions based on the theorem related to a Helmholtz-Lagrange invariant (which is also called a Huygens-Smith invariant, or a Smith-Helmholtz invariant), so that the $\Delta\theta m$ cannot be arbitrarily set up. Therefore, the apex angle $\Delta\theta p$ of the cone angle region about the distribution as to the principal rays (Lpf, Lpf') is the only parameter which can be set freely by design. Here, since the $\Delta\theta p$ is set to 0 ($\Delta\theta p=0$), the maximum value of the deflection angle which can be given to the light deflection unit (Md) can be maximized. However, when the above-described angle margin $\Delta\Phi$ is a negative value even in the case of $\Delta\theta p=0$, although the light use efficiency decreases with introduction of the deflection, it remains the best to set it as $\Delta\theta p=0$. Therefore, it turns out that it is advantageous to make the principal rays approximately parallel to one another after passing through the second optical system (Ef), in solution of the problem that the uniformity of the projected light due to the speckle deteriorates.

As one of embodiments of the coherent light source apparatus according the present invention, the first light emission region (Gs) may be made up of two or more or distributed radiant points (Ks, Ks', . . . ), and it is suitable that principal rays (Lps, Lps', . . . ) of light flux which form respective radiant points (Ks, Ks', . . . ) of the first light emission region (Gs) pass through near the center of the third light emission region (Gf), after passing through the second optical system (Ef).

Figure 6:
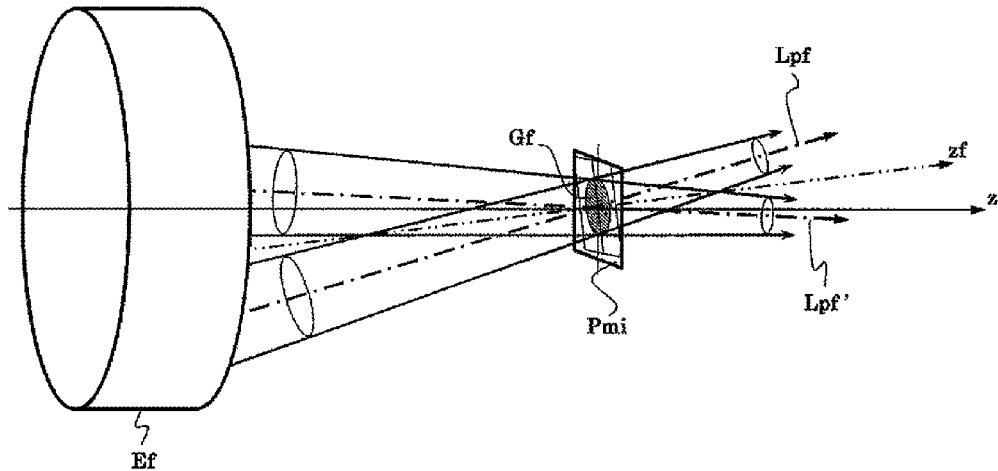
FIG. 6 is a simplified and conceptual diagram showing part of a coherent light source apparatus according to an embodiment of the present invention.

FIG. 6 shows a situation where when light flux which forms the radiant points (Ks, Ks', . . . ) of the first light emission region (Gs) enters an optical system, and passes through the second optical system (Ef) via the first optical system (Eu) and the light deflection unit (Md), in the space of the first light emission region (Gs), for example, the principal rays (Lps, Lps', . . . ) shown in FIG. 3 turn into the principal rays (Lpf, Lpf') which pass near the center of the third light emission region (Gf).

Although the optical axis of the optical system is a z axis, as to a zf axis, an inclination is given to the z axis of the optical system, which is located upstream of the light deflection unit (Md), by the light deflection unit (Md), and it is projected by the second optical system (Ef), so that a zf axis may be formed. In addition, in order to avoid complexity of the figure, a light mixing unit (Fm) is omitted therefrom and only the incident end (Pmi) is shown in the figure. Moreover, the third light emission region (Gf) is configured as large in size as possible, as long as it does not go out of the incident end (Pmi).

The optical system, in which the principal rays (Lpf, Lpf') pass through the vicinity of the center of the third light emission region (Gf), can be realized by a configuration in which the exit pupil of the second optical system (Ef) is formed on the third light emission region (GO. For that purpose, when an image of the pupil in the space of the first light emission region (Gs) is projected by the first optical system (Eu) as an exit pupil, it may be designed so that the third light emission region (Gf) may be conjugate to the second light emission region (Gu). In addition, what is necessary is to just design it based on the case where the deflection angle of the light deflection unit (Md) is zero.

FIG. 6 shows, as an example, that an output image, which the second optical system (Ef) forms, may lie at infinity or at distant place similarly, so as to correspond to the radiant points (Ks, Ks', . . . ) of the first light emission region (Gs). In order to realize the optical system whose output image point is located at such distant place, what is necessary is just to design so that the image of the first light emission region (Gs) may be formed near the input side focal plane of the second optical system (Ef), and this design may coexist with the design in which the exit pupil of the second optical system (Ef) may be formed on the third light emission region (Gf).

When a fly eye integrator is used as the light mixing unit (Fm), it is especially suitable to configure the structure so that the principal rays (Lpf, Lpf') may pass near the center of the third light emission region (Gf) after passing through the second optical system (Ef). The reason therefor will be given below.

As described above, in the coherent light source apparatus which forms the third light emission region (Gf) which is conjugate to the second light emission region (Gu), when such a fly eye integrator is used as the light mixing unit (Fm), although it is desirable to form the third light emission region (Gf), which is formed near the incident end (Pmi), as an illumination region which spreads over the entire region of the incident end (Pmi), an important point is that there is the constrained angle, in which there is an upper limitation with respect to a distribution range of the angle of the light rays contained in light flux. The situation where there is the constrained angle, is similar to the situation in an optical device such as a projector including an optical guide where there is the constrained angle $\Delta\Theta$. To come right to the point, in short, if there are light rays exceeding the constrained angle specified by the optical system, it is advantageous to make a change so as not to exceed it as much as possible.

Since as to the exit pupil, principal rays collect at the center of the third light emission region (Gf), it may be said that it is the most compact position on an optical axis in order that light flux may enter the incident end (Pmi) efficiently. If, in the space where light flux exists, a screen is set at right angle with respect to an optical axis and the screen is moved along the optical axis, the size of a region where light is illuminated, changes. However, because the angle distribution of the light rays contained in the light flux does not change, it may be necessary to select the position thereof, at which the size of the region where the light is illuminated becomes the most compact, and an exit pupil is selected as the strongest candidate. In addition, although there may be a more compact position near a portion which is conjugate to the first light emission region (Gs), because of the above-mentioned reason, this position is inappropriate when a fly eye integrator is used as the light mixing unit (Fm).

When the size of an exit pupil, i.e., the third light emission region (Gf), is too small as compared with the size of the incident end (Pmi), because it is compact, if the magnification of the image formation to the third light emission region (Gf) from the second light emission region (Gu) which has a conjugate relation therewith is increased so as to be fit in the size of the incident end (Pmi), since a distribution range $\Delta\theta$ of the angles of the rays contained in light flux becomes small according to the theorem about the Helmholtz-Lagrange invariant, part obtained by deducting this distribution range from the constrained angle, i.e., an angle margin $\Delta\Phi$, increases, so that it becomes possible to assign this increased margin angle to an increase in the maximum value of the deflection angle, which can be given to the light deflection unit (Md).

However, even if the angle range $\Delta\theta$ is set to the minimum, when the angle margin $\Delta\Phi$ is a negative value, although there is a decline in light use efficiency with introduction of a deflection, the minimization of $\Delta\theta$ remains the best way. Therefore, it turns out that to configure the structure so that the principal rays pass near the center of the third light emission region (Gf) after passing through the second optical system (Ef), is advantageous in solving the problem that the uniformity of the projected light due to the speckle deteriorates.

As one of embodiments of the coherent light source apparatus according the present invention, preferably when the second optical system (Ef) forms a third light emission region (Gf) near the incident end (Pmi) of a latter light mixing unit (Fm), in response to an input of the light flux (Bd) deflected by the above-mentioned light deflection unit (Md), an image conjugate to the first light emission region (Gs) is formed at a distance place, and the third light emission region (Gf) which is conjugate to the exit pupil (Quo) of the first optical system (Eu) is formed, so that the third light emission region (Gf) is moved continuously in the incident end (Pmi) by an operation of the light deflection unit (Md).

Similarly to the case, which is explained above referring to FIG. 22, in a fly eye integrator, an image of a rectangle which is an outer shape of each lens arranged in vertical and horizontal directions on an upstream fly eye lens (Fm1) forms an illumination region (Gk) which is one synthesized quadrangle image, by the downstream fly eye lens (Fm2) on a light emission side and an illumination lens (Fmc).

Figure 7:
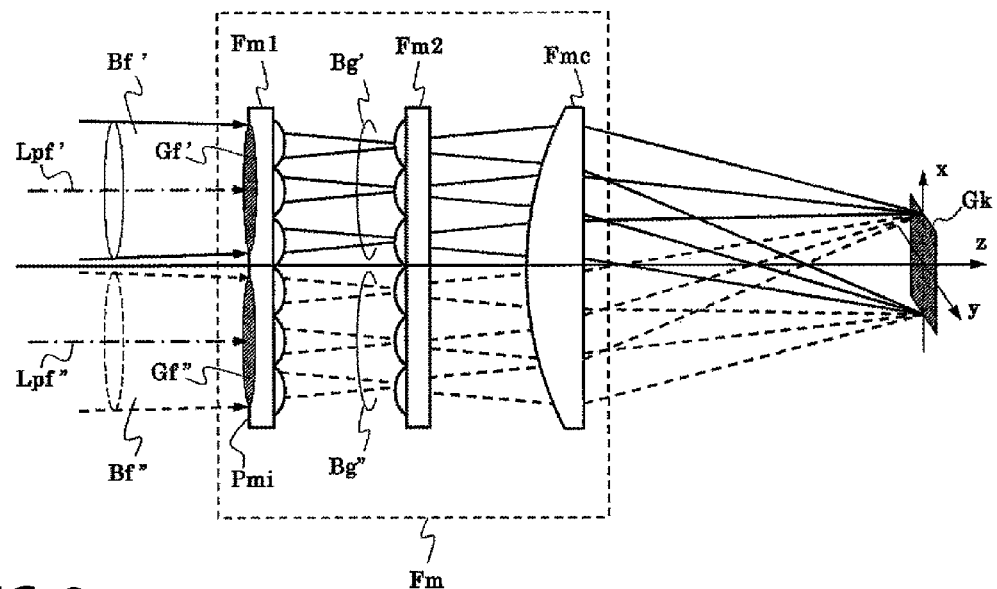
FIG. 7 is a simplified and conceptual diagram showing part of a coherent light source apparatus according to an embodiment of the present invention.

When the third light emission region (Gf) is located at the position of a region (Gf) shown in FIG. 7, part of the upstream fly eye lens (Fm1) is irradiated with light flux (Bf), which forms it, and a partial light flux group (Bg') is formed thereby forming the illumination region (Gk). Moreover, as shown with a dashed line, when the third light emission region (Gf) moves to the position of a region (Gf') by continuously changing a direction in which the light flux (Bu) is deflected, by the light deflection unit (Md), other parts of the upstream fly eye lens (Fm1) is irradiated with light flux (Bf') which forms this, whereby a partial light flux group (Bg"), which is different from the partial light flux group (Bg') is formed, so as to form the illumination region (Gk) similarly. Thus, if in formation of the illumination region (Gk), when part, which the upstream fly eye lens (Fm1) uses, is continuously changed by an operation of the light deflection unit (Md), a speckle always moves since the angle of the light rays is continuously changed at the time of forming the illumination region (Gk), whereby if it is averaged within a suitable period corresponding to the movement speed, the above-mentioned spotty or patchy pattern of the speckle becomes fine, so that the speckle becomes invisible.

As can be more easily understood from the operating principle of the fly eye integrator which is explained above referring to FIG. 22, it is desirable that an image at a distant place, which is conjugate to the second light emission region (Gu) formed by the second optical system (Ef), be ideally an image at infinity. Moreover, as can more easily understood from the operating principle of a fly eye integrator in a similar manner, it is desirable that at all the positions of the third light emission region (Gf) which continuously changes by an operation of the light deflection unit (Md), the principal ray from the center image point of the first light emission region (Gs) contained in the light flux (Bf) which forms the third light emission region (Gf), such as the principal ray (Lpf') from the center image point of the first light emission region (Gs) contained in the light flux (Bf), or the principal ray (Lpf') from the center image point of the first light emission region (Gs) contained in the light flux (Bf'), etc., be maintained so as to be as parallel as possible to the axis (z axis) of the fly eye integrator, that is, the above-mentioned light mixing unit (Fm).

If deviation of an image, which is conjugate to the second light emission region (Gu) formed by the second optical system (Ef) from the infinity, or deviation of the principal ray from the center image point of the first light emission region (Gs) contained in the light flux (Bf) from the parallel to the axis of the light mixing unit (Fm), becomes large, since light rays which cannot contribute to formation of the illumination region (Gk) increases, that is, the utilization efficiency of light drops, what is necessary is just to suppress the degree of the deviation within the limit of decrease in the utilization efficiency of a permissible light.

The reason why paying attention to the center image point of the first light emission region (Gs) is that since the third light emission region (Gf) conjugate to the exit pupil (Quo) of the first optical system (Eu) is formed near the incident end (Pmi) of the light mixing unit (Fm) at a finite distance (which is infinity), and this is equivalent to the exit pupil of the second optical system (Ef) so that since all the principal rays may not be parallel to one another, it is desired that the dissatisfaction from ideal parallel is controlled so as to be small as a whole by determining a representative image point and making it parallel to a z axis. Therefore, attention is paid to the center image point of the above-described first light emission region (Gs) as the representative image point, so that it does not need to be a center in a strict meaning. As in a first light emission region (Gs) shown in FIG. 19B, which will be described below, when there is no radiant point at a center, it may be represented by a hypothetical image point, or one of the radiant points (Ks, Ks', . . . ) which actually exist near the center may be focused on.

As described above, when the coherent light source (Sc) is a semiconductor laser, a radiant section of the diverging light which exists on the surface of a semiconductor chip serves as a first light emission region (Gs), and further, the embodiment of the present invention which is suitable in the case where two or more semiconductor lasers are used, is described above. Not only the primary light source which actually generates light but also a secondary light source which emits light transmitted or projected from the primary light source, may serve the first light emission region (Gs).

Figure 8:
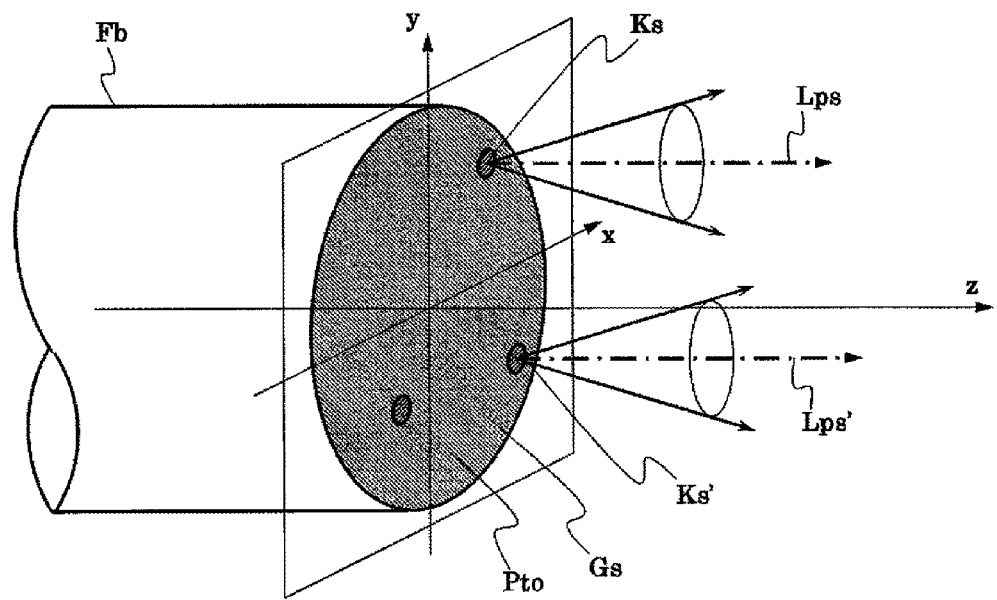
FIG. 8 is a simplified and conceptual diagram showing part of a coherent light source apparatus according to an embodiment of the present invention.

As an example, the first light emission region (Gs) may be formed by the emission end (Pto) of the optical fiber (Fb), wherein light of the coherent light source (Sc) is inputted in an incident end of the optical fiber and as shown in FIG. 8, the entire core on a side of the emission end of the optical fiber serves as the first light emission region (Gs). At this time, even if the number of optical fibers is one, it cannot be usually treated as a point light source, so that the first light emission region (Gs) must be considered as a light emission region in which radiant points are continuously distributed within a limited area. Namely, the radiant points (Ks, Ks', . . . ) are distributed approximately uniformly and continuously on the emission end (Pto) which is a core of an optical fiber, and light is emitted in an apex angle of a cone angle region of each of the radiant points (Ks, Ks', . . . ) where marginal rays defined by the structure of an optical fiber exist and are distributed. Since the principal rays (Lps, Lps', . . . ) become parallel to the axis of the optical fiber in this case, what is necessary is just to coincide this axis with the z axis which is an optic axis of the optical system, wherein it becomes the same situation as what is described above referring to FIG. 4.

As shown in FIG. 9, when the two or more optical fibers (Fb, Fb', . . . ) are used, they are arranged so that the axes of all the optical fibers may become parallel to the z axis which is the optic axis of the optical system, and further the emission ends (Pto, Pto', . . . ) of all the optical fibers (Fb, Fb', . . . ) may be located on one plane. In this case, the region which is formed by the whole emission ends (Pto, Pto', . . . ) functions as the first light emission region (Gs). In this case, for example, what is necessary is just to arrange the emission ends (Pto, Pto', . . . ) so that the first light emission region (Gs) whose shape is approximately similar figure of the incident end (Pmi) may be formed.

In addition, FIGS. 8 and 9 show only the core of the optical fiber, so that a clad, the structure for holding the emission ends (Pto, Pto', . . . ) (especially in the case of the two or more optical fibers) in a predetermined position, cable covering, etc. are omitted.

The coherent light source apparatus according to the embodiment of the present invention in which an optical fiber is used is advantageous in that a degrees of freedom in the arrangement of host, using output light from the coherent light source apparatus of the embodiment of the present invention apparatus, increases by separating part where light is generated from part where light is used and connecting them to each other by a flexible cable, repair at time of failure and component replacement thereof become easy, and the optical fiber itself can have a function of a light mixing unit. That is, since light of the primary light source such as a semiconductor laser, which does not originally contain a speckle, is passed through the optical fiber, so as to be changed into the secondary light source which has a fine speckle, and then passed through the light mixing unit (Fm), it is possible to enhance the effect in which a spotty or patchy pattern of the speckle becomes fine, so that the speckle becomes difficult to be seen.

What is necessary is just to adopt a suitable one according to the operational mechanism of the light deflection unit (Md), which is an object to be driven, as the configuration of the light deflection unit drive circuit (Umd). Where an acousto-optical deflector (AOD) is used as, for example, the light deflection unit (Md), when an optical deflection synchronization signal (Syn) in form of a pulse-train is supplied, a rectangular wave signal, which is inverted, for example, in synchronization with a rise of the optical deflection synchronization signal (Syn) is generated, wherein a DC component of this rectangular wave signal is removed and integrated so as to be converted into a triangular signal. Since frequency is changed in a triangle shape in synchronization with the optical deflection synchronization signal (Syn), by controlling a frequency variable oscillator whose frequency is high, by a signal which is obtained by adding suitable DC offset to the triangular wave signal, that is, the high-frequency signal which is frequency-modulated can be generated, what is necessary is just to configure the structure so that the acousto-optical deflector may be driven with this high-frequency signal through a suitable amplifier.

Or where a vibration plate of a sine wave drive is used as, for example, the light deflection unit (Md), because an AC signal, in which frequency changes in a shape of a sine wave in synchronization with the optical deflection synchronization signal (Syn), can be generated by removing a DC component and a harmonics component of the rectangular wave signal, what is necessary is just to configure the structure so that the vibrating plate may be driven with this AC signal through a suitable amplifier.

Further, where for example, a galvanometer is driven so that a saw tooth wave deflection operation may be performed in which more complicated drive wave form is needed as the light deflection unit (Md), as shown in FIG. 10, this is changed into a waveform generation clock signal (Sck) which is obtained by raising frequency natural number times using a frequency multiplying circuit (Ufx) on the basis of the optical deflection synchronization signal (Syn), and then this is counted by an address generation counter (Ucnt), so that a table address (Atb) is generated, so as to be inputted into an address terminal of a look-up table (LUT) formed by using a RAM etc. Since table data (Dtb) can be read, if serial waveform data is beforehand written in to the look-up table (LUT), when the DA conversion of the read table data (Dtb) is carried out using a DA converter (DAC), the wave-form signal (Sdr) for driving the galvanometer can be generated in synchronization with the optical deflection synchronization signal (Syn). The above-mentioned wave-form signal (Sdr) is amplified through an amplifier (Ap), can supply deflection drive electric power (Pwdr) to the above-mentioned light deflection unit (Md), and can drive it.

In addition, the frequency multiplying circuit (Ufx) can be realized by configuring a phase-locked loop, i.e., PLL by using the variable-frequency oscillator (VCO) for generating the waveform generating clock signal (Sck), a frequency demultiplier (Udv) formed using a counter, for generating the dividing clock signal (Sdck) which is obtained by dividing the waveform generation clock signal (Sck) by the frequency demultiplier ratio equal to a natural number to be multiplied, and a phase comparison drive control circuit (Upc) which compares the phase of the optical deflection synchronization signal (Syn) and that of the dividing clock signal (Sdck) with each other.

The phase comparison drive control circuit (Upc) controls an oscillating frequency control signal (Sfc) so as to increase the frequency of the variable-frequency oscillator (VCO) when the phase of the dividing clock signal (Sdck) is retarded from that of the optical deflection synchronization signal (Syn), and so as to decrease the frequency of the variable-frequency oscillator (VCO) in advance. Specifically, it is configured so that a positive pulse may be generated after receiving the optical deflection synchronization signal (Syn) until the dividing clock signal (Sdck), and a negative pulse may be generated after receiving the dividing clock signal (Sdck) until the optical deflection synchronization signal (Syn) whereby the oscillating frequency control signal (Sfc) is generated by integrating these pulses.

The count cycle of the address generation counter (Ucnt) is set up so as to be equal to data number Nt which is saved in the look-up table (LUT), and the count cycle Mt of the frequency demultiplier (Udv) can be set up by selecting a suitable natural number i, so that an equation Mt=Nt/I may be satisfied. At this time, driving waveform data for one cycle is generated by receiving pulses of the optical deflection synchronization signal (Syn), whose number is i. Although the value of Mt becomes larger as i is smaller, since a PLL operation may become unstable when the value of Mt is too large, what is needed is just to determine a suitable value of i in the light of the stability of the required operation. In addition, although in FIG. 10, for the simplification of explanation, the address generation counter (Ucnt) and the frequency demultiplier (Udv) are provided as different counters from each other. When the apparatus is actually made up, it is possible to simplify a circuit by using part of the former as the latter, and for example, adopting a middle digit of a bit signal of the address generation counter (Ucnt) as the dividing clock signal (Sdck).

Figure 11A:
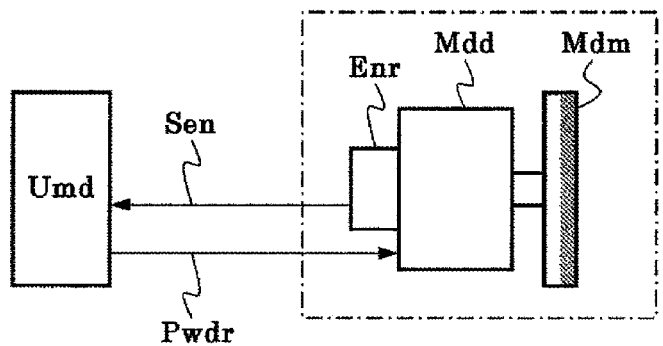
FIGS. 11A and 11B are simplified block diagrams showing part of a coherent light source apparatus according to an embodiment of the present invention.

In case of the light deflection unit (Md), in which, for example, an optical element for deflection such as a mirror, is rotated by a rotary motor (Mdd), as shown in FIG. 11A, the rotary motor (Mdd) has a rotation sensor (Enr) which is a rotary encoder, a tachometer, etc., for generating a rotation detection signal (Sen) at every predetermined rotation angle of the rotation (rev), and what is needed is just to configure the light deflection unit drive circuit (Umd) so that rotation of the rotary motor (Mdd) may be controlled by PLL, so that the rotation detection signal (Sen) is synchronized with the optical deflection synchronization signal (Syn).

Figure 11B:
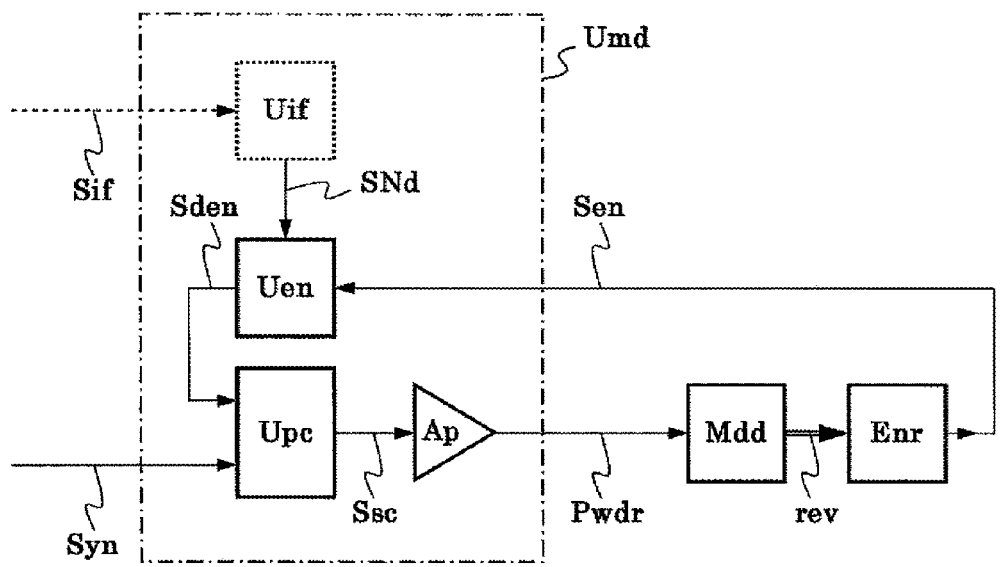

A dividing rotation detection signal (Sden), which is obtained by dividing the frequency of the rotation detection signal (Sen) by a natural number, is generated by the rotation detection signal frequency demultiplier (Uen) which is configured by using a counter as shown in FIG. 11B, and the optical deflection synchronization signal (Syn) and the dividing rotation detection signal (Sden) are inputted into the phase comparison drive control circuit (Upc). This phase comparison drive control circuit (Upc) compares the phase of the optical deflection synchronization signal (Syn) and the dividing rotation detection signal (Sden), and drive capability (Ssc), i.e., a revolving speed control signal, is adjusted when the phase of the dividing rotation detection signal (Sden) is retarded from the optical deflection synchronization signal (Syn), so that the number of rotation of the rotary motor (Mdd) is increased, and when it is advanced the number of rotation of the rotary motor (Mdd) is reduced. Specifically, after receiving the optical deflection synchronization signal (Syn) until the dividing rotation detection signal (Sden), a positive pulse is generated and after receiving the dividing rotation detection signal (Sden) until the optical deflection synchronization signal (Syn), a negative pulse is generated. In such a configuration, the revolving speed control signal (Ssc) is generated by integrating these pulses. The revolving speed control signal (Ssc) is amplified through an amplifier (Ap), so that a deflection drive electric power (Pwdr) is supplied to the light deflection unit (Md) so as to drive it.

Here, when the number of pulses of the rotation detection signal (Sen), which is generated by the rotation sensor (Enr) per rotation of the rotary motor (Mdd), is Md, and the frequency demultiplier ratio of the rotation detection signal frequency demultiplier (Uen) is set as Nd, the rotary motor (Mdd) is controlled so as to be rotated one time by reception of a Md/Nd pulse of the optical deflection synchronization signal (Syn). In addition, although in the figure, this is not divided with respect to the optical deflection synchronization signal (Syn), and is directly inputted into the phase comparison drive control circuit (Upc). This is because it is unrelated to the essence of PLL control, and for example, because of a numerical setup etc., the frequency demultiplier, which has a suitable frequency demultiplier ratio, can be provided between the optical deflection synchronization signal (Syn) and the phase comparison drive control circuit (Upc).

Description of a synchronous operation of the light deflection unit (Md) with respect to the optical deflection synchronization signal (Syn) according to especially PLL control will be supplemented below. In case where a periodic perturbation is added to a route of an a propagation path of light or a light path length in the propagation path, a viewable flicker due to interference with time-periodic modulation is caused because both of the cycles are not in agreement with each other or one of the cycles or the other is not fixed to an integral multiple. A measure for solving this problem, in which, for example, both cycles are strictly adjusted and matched in advance so that both of the cycles may become a relation in which the flicker is not produced, may not function well. This is because the operating cycle of the apparatus changes due to various factors (a temperature change, changes with passage of time, etc.), and because the matching relation between the light source apparatus the host apparatus using the light will not be secured if a combination of light source apparatus and the host apparatus changes. In the above-mentioned measure adopted in the embodiment of the present invention, once the good matching relation of both cycles is found, even if there are changes and differences of combination thereof as described above, it is possible to realize and always maintain the relation by feedback control.

Since the operational conditions of the host apparatus combined with the coherent light source apparatus according to the embodiment of the present invention are various, it is necessary to find out, through a trial and error depending on the case, what kind of conditions under which the above-mentioned good matching relation appears, with respect to the time-periodic modulation performed by host apparatus, and the method for generating the optical deflection synchronization signal (Syn), which is outputted towards the coherent light source apparatus according to the embodiment of the present invention, for example, a generation rate of the optical deflection synchronization signal (Syn) to an operation of time-periodic modulation, or a setup of a value of the frequency demultiplier ratio Nd of the rotation detection signal frequency demultiplier (Uen), etc. In view of the host apparatus in which the coherent light source apparatus of the embodiment of the present invention is used, although it is possible to manage the method for generating the optical deflection synchronization signal (Syn) on the host apparatus side. However, if it is possible to set the value of the frequency demultiplier ratio Nd of the rotation detection signal frequency demultiplier (Uen) on the host apparatus side, even when there are two or more operational conditions, it is very convenient since all can be managed on the host apparatus side.

In order to realize this, the light deflection unit drive circuit (Umd) as shown in a dashed line in FIG. 11B has a frequency demultiplier condition setting interface (Uif) for receiving a dividing condition setting signal (Sif) inputted from the outside, so that the frequency demultiplier ratio Nd can be set up when the rotation detection signal (Sen) is divided and the frequency demultiplier ratio data signal (SNd) indicating the frequency demultiplier ratio Nd is supplied to the rotation detection signal frequency demultiplier (Uen). The frequency demultiplier ratio data signal (SNd) is usually provided in a circuit as a binary digital numerical value in form of multiple bits.

In addition, the circuit shown in FIG. 10 or an FIG. 11B is an example for explaining the configuration in the case of realizing coherent light source apparatus according to the embodiment of the present invention using PLL technology, wherein for example, it is configured by using a dedicated IC for PLL control, or an IC for a general-purpose high-speed microprocessor for digital signal processing. Furthermore, if the light deflection unit (Md) can be operated, so that a direction in which the light flux (Bu) is deflected in synchronization with the optical deflection synchronization signal (Syn) is continuously changed, it may be realized using technology other than PLL.

Figure 12:
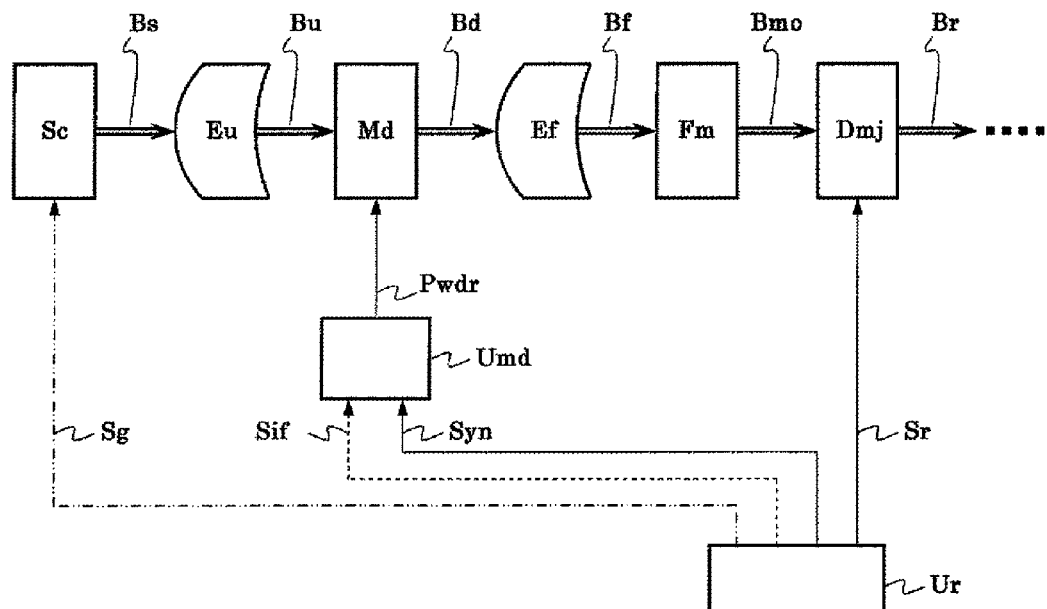
FIG. 12 is a simplified block diagram showing part of a projector according to an embodiment of the present invention.

As described above, in a projector which projects and displays an image by using some sort of light source such as a conventional high intensity discharge lamp, although a light uniformizing unit such as an optical guide and a fly eye integrator is an indispensable component, this light uniformizing unit, as described above, can also be made to function as the light mixing unit (Fm) which is a component of the embodiment of the present invention, in order to solve the problem in which the uniformity of light to be projected deteriorates due to a speckle. Therefore, when a projector is realized as a host apparatus using output light from the coherent light source apparatus of the embodiment of the present invention, if a light uniformizing unit is configured to so as to serve as the light mixing unit (Fm) as shown in FIG. 12, the cost thereof may be reduced.

For example, in case of a projector shown in FIG. 21, light flux (Bf) from a second optical system (Ef) is inputted into a light uniformizing unit (FmA) formed by an optical guide. Therefore, a two-dimensional light amplitude modulation element (DmjA) is arranged as a two-dimensional light amplitude modulation element (Dmj) on a downstream side thereof. Moreover, for example, in case of a projector shown in FIG. 22, light flux (Bf) from a second optical system (Ef) is inputted into a light uniformizing unit (FmB) formed by a fly eye integrator. Therefore, a two-dimensional light amplitude modulation element (DmjB) is arranged as a two-dimensional light amplitude modulation element (Dmj) on a downstream side thereof. Similarly, in the projector of the embodiment of the present invention, the two-dimensional light amplitude modulation element (Dmj) performs two-dimensional light amplitude modulation to the light flux (Bmo) emitted from the light mixing unit (Fm), according to the image signal (Sr) which is generated by an image signal generation circuit (Ur), whereby the modulated light flux (Br) is generated.

Therefore, the image signal generation circuit (Ur) which manages the time-periodic modulation included in the modulation light flux (Br), can generate an optical deflection synchronization signal (Syn) in synchronization with a time-periodic modulation operation, and output this to a light deflection unit drive circuit (Umd). In such a configuration, in the projector shown in FIG. 12, it is possible to solve the problem in which the uniformity of light to be projected deteriorates due to a speckle, while avoiding side effects such as a flicker viewed due to interference with time-periodic modulation. Moreover, as shown in a dashed line in the figure, a dividing condition setting signal (Sif) for setting up the frequency demultiplier ratio Nd in a dividing operation of the rotation detection signal (Sen) performed by the light deflection unit drive circuit (Umd), is outputted to a light deflection unit drive circuit (Umd) together with the optical deflection synchronization signal (Syn), as described above, when there are two or more operational conditions of the projector, which is combined with the coherent light source apparatus of the embodiment of the present invention, all can be managed on the projector side so that the above-mentioned good matching relation can be realized.

Although the embodiments are mainly described wherein a projector adds the time-periodic modulation to the output light from the coherent light source apparatus of the embodiment of the present invention through the two-dimensional light amplitude modulation element (Dmj). For example, in case where the coherent light source apparatus of the embodiment of the present invention is configured, so that intensity modulation can be added, according to an intensity modulation signal (Sg), to light emitted from the light sources (Sc) such as a semiconductor laser which forms the first light emission region (Gs), as shown in an alternate long and two short dashes line in FIG. 12, when a projector generates the intensity modulation signal (Sg) so as to perform the time-periodic modulation, a fluctuation component resulting from the dynamic behavior of the light deflection unit (Md), and a flicker etc. which is viewed due to interference with this time-periodic modulation are generated. This problem can be solved by configuring the projector so that the image signal generation circuit (Ur) may generate the optical deflection synchronization signal (Syn) in synchronization with the intensity modulation signal (Sg).

As described above, in a conventional projector, for example, a dynamic color filter such as a color wheel is arranged on a downstream side of the light uniformizing unit, so as to illuminate a two-dimensional light amplitude modulation element with R-G-B color sequential light flux (red, green and blue), thereby realizing color display in a time dividing manner, or a dichroic mirror or dichroic prism is arranged on a downstream side of the light uniformizing unit so as to illuminate the two-dimensional light amplitude modulation element which is independently provided for each of the three primary colors of R-G-B separated from the light, and a dichroic mirror or dichroic prism for performing color synthesis of the modulated light flux of the R-G-B three primary colors is arranged.

Also in the projector of the embodiment of the present invention, although the light source having a required kind of hue is needed, the first light emission region (Gs) in white color which is formed by the color synthesis, is formed by using, for example, the three primary color coherent light source of R-G-B, and as described above, the white light enters the light mixing unit (Fm), which is a light uniformizing unit, through a first optical system (Eu), a light deflection unit (Md), and a second optical system (Ef), whereby similarly to that of the conventional projector, the time dividing operation by the dynamic color filter or color separation and a color synthesis can be performed on a downstream side of the light mixing unit (Fm).

As shown in FIG. 9, in the case of where the optical fiber is used, when the color synthesized first light emission region (Gs) is formed, the first light emission region (Gs) can be made up of two or more color parts by bundling the emission ends (Pto, Pto', . . . ) of the optical fibers where light in different color enters each incident end thereof. Or a monochromatic first light emission region (Gs) is formed for every color, and they are overlaid using a color-synthesizing unit such as a dichroic mirror, so that the light is sent to a first optical system (Eu), whereby the first light emission region (Gs), which is color-synthesized, can also be formed. In addition, when the color-synthesizing unit side is viewed from the first optical system (Eu) side, one first light emission region (Gs) which has two or more colors, can be viewed, and in the optical field, this status is regarded as the color-synthesized first light emission region (Gs) being formed.

Or a first light emission region (Gs) is independently formed for every color, and a two-dimensional light amplitude modulation element is illuminated to generate a monocolor image therewith through a first optical system (Eu), a light deflection unit (Md), a second optical system (Ef), and a light uniformizing unit slack light mixing unit (Fm), whereby this may be color-synthesized.

A color sequential color image may be generated by forming a color sequential first light emission region (Gs) by driving the coherent light source in a time dividing manner in the order of R-G-B, and by illuminating a two-dimensional light amplitude modulation element through a first optical system (Eu), a light deflection unit (Md), a second optical system (Ef), and a light uniformizing unit slack light mixing unit (Fm).

Description of an embodiment according to the present invention will be given below, referring to drawings showing more concrete structure. First, a coherent light source apparatus shown in FIG. 13 will be explained. A first light emission region (Gs) is formed by a radiant section of diffusing light which exists on a surface of a semiconductor chip in a semiconductor laser light source unit (Ls) whose light source is made up of one or two or more semiconductor lasers. The first optical system (Eu) which is made up of a collimating lens (Es) for changing it into an image at infinity, and an imaging lens (Eu1) forms an image of a second light emission region (Gu) on a deflection mirror (Mdm), as an image conjugate to the first light emission region (Gs). Although in the case of the semiconductor laser light source unit (Ls), whose light source is made up of two or more semiconductor lasers, although the configuration is based on the case where all the principal rays from the first light emission region (Gs) are parallel to an optical axis, even if they are not parallel to each other, an optical system having similar functions can be realized by controlling and designing the position of the image plane on an optical axis, and a pupil position.

The deflection mirror (Mdm) is, for example, circular, and is attached to the rotational axis of a rotary motor (Mdd) so as to be rotated so that the normal vector of a reflective face of the deflection mirror (Mdm) may incline by only a predetermined angle with respect to a rotational axis. By such a configuration, since a trajectory of the normal vector is rocked so as to draw a circular conical face, with rotation of the rotary motor (Mdd), the deflection mirror (Mdm) turns into a rotation rocking mirror, and functions as a light deflection unit (Md). In addition, what is necessary is just to decide the above-mentioned angle formed by the normal vector of the reflective face and the rotational axis, according to an angle margin $\Delta\Phi$.

Light flux (Bd) deflected by the light deflection unit (Md) enters a second optical system (Ef) which is made up of lenses (Ef11, Ef12) and a last lens (Ef13), and in this second optical system (Ef), an image of a third light emission region (Gf) is formed on an incident end (Pmi) of the light mixing unit (Fm) which is made up of an optical guide, as an image conjugate to a second light emission region (Gu) on the deflection mirror (Mdm). At this time, as explained above with respect to FIG. 5, what is necessary is just to make the principal rays approximately parallel to one another after passing through the second optical system (Ef).

As described above, the optical system, in which the principal rays of output light flux become approximately parallel to one another, can be realized by a design in which an input side focal point of the second optical system (Ef) and an entrance pupil of the second optical system (Ef) may be in agreement with each other. However, simply put referring to FIG. 13, what is needed is just to make the input side focal point and the entrance pupil (Qf3) in agreement with each other, by paying attention to the last lens (Ef13). And this entrance pupil (Qf3) is based on the case where the deflection angle of the deflection mirror (Mdm) is zero, and is a conjugate image of the exit pupil (Qu) of a collimating lens (Es), and when assuming that all the principal rays from the first light emission region (Gs) are parallel to the optical axis, the exit pupil (Qu) is in agreement with the output side focal point of the collimating lens (Es).

Figure 13:
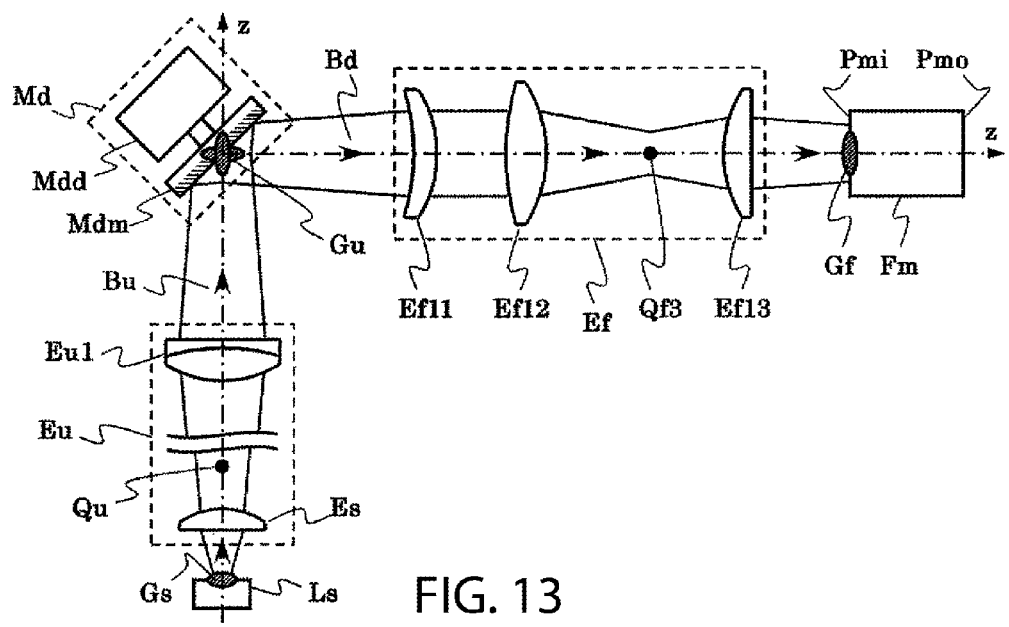
FIG. 13 is a simplified diagram showing an aspect of a coherent light source apparatus according to an embodiment of the present invention.

By the above-mentioned configuration, in the coherent light source apparatus shown in FIG. 13, the maximum value of the deflection angle which can be given to the light deflection unit (Md) can be maximized. However, when the above-described angle margin $\Delta\Phi$ is a negative value, even in the case of $\Delta\theta p=0$, although the light use efficiency decreases with introduction of the deflection, it remains the best to set it as $\Delta\theta p=0$. Therefore, it is advantageous in avoiding the problem in which the uniformity of the light projected due to the speckle deteriorates.

Moreover, as shown in FIG. 11A, the rotary motor (Mdd) has a rotation sensor (Enr), wherein a rotation detection signal (Sen) is fed back, and it is driven by the light deflection unit drive circuit (Umd) so that the rotary motor (Mdd) may be rotated by a phase-locked loop in synchronization with an optical deflection synchronization signal (Syn). Therefore, when the optical deflection synchronization signal (Syn) is synchronized with the time-periodic modulation added to the output light from the coherent light source apparatus according to the embodiments of the present invention, side effects such as a flicker seen due to interference with time-periodic modulation, can be avoided.

Next, description of a coherent light source apparatus shown in FIG. 14 will be given below. Similarly to that described above with respect to FIG. 13, a first light emission region (Gs) is formed by a radiant section of diffusing light which exists on a surface of a semiconductor chip in a semiconductor laser light source unit (Ls) whose light source is made up of one or two or more semiconductor lasers. In addition, where the light source of the semiconductor laser light source unit (Ls) is made up of two or more semiconductor lasers, although it is configured based on the case where all principal rays from the first light emission region (Gs) are parallel to an optical axis, even if they are not parallel thereto, the optical system having similar functions can be realized by controlling and designing the position of an image plane on an optical axis and a pupil position.

The first optical system (Eu) which is made up of a collimating lens (Es) for changing the first light emission region (Gs) into an image at infinity, and lenses (Eu21, Eu22) forms an image of a second light emission region (Gu) on the deflection mirror (Mdm) as an image conjugate to the exit pupil (Qu) of the collimating lens (Es) (which is in agreement with the output side focal point of the collimating lens (Es) when all the principal rays from the first light emission region (Gs) are parallel to an optical axis).

Figure 14:
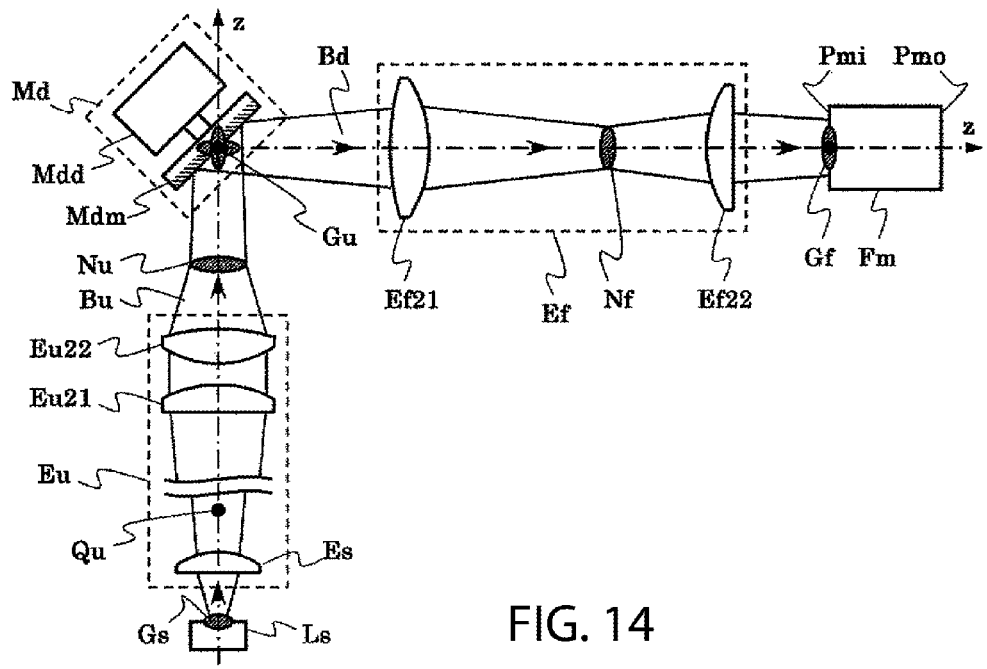
FIG. 14 is a simplified diagram showing an aspect of a coherent light source apparatus according to an embodiment of the present invention.

In addition, at this time, although in FIG. 14, an image conjugates to the first light emission region (Gs) is shown as a conjugate image (Nu) which exists between the first optical system (Eu) and the deflection mirrors (Mdm), this may be located between the lenses (Eu21, Eu22). Moreover, similarly to what is described in relation to FIG. 13, the deflection mirror (Mdm) functions as a light deflection unit (Md), and for example, the rotation rocking mirror using the rotary motor (Mdd), etc. is suitable therefor. And the rotary motor (Mdd) has a rotation sensor (Enr) as shown in FIG. 11A, wherein a rotation detection signal (Sen) is fed back, and it is driven by the light deflection unit drive circuit (Umd) so that the rotary motor (Mdd) may is rotated by a phase-locked loop in synchronization with an optical deflection synchronization signal (Syn). The light flux (Bd) deflected by the light deflection unit (Md) enters a second optical system (Ef) which is made up of a lens (Ef21) and a last lens (Ef22). In this second optical system (Ef), an image of a third light emission region (Gf) is formed on an incident end (Pmi) of the light mixing unit (Fm) which is made up of a fly eye integrator, as a conjugate image to the second light emission region (Gu) on the deflection mirror (Mdm). At this time, as described above with respect to FIG. 6, an output image that the second optical system (Ef) forms, may suitably lie at infinity or at a distant place similar thereto.

As described above, in order to realize the optical system whose output image point is located at such distant place, what is needed is just to design so that the image of the first light emission region (Gs) may be formed near the input side focal plane of the second optical system (Ef). However, simply put, referring to FIG. 14, it is necessary to configure the structure so that the conjugate image (Nf) of the conjugate image (Nu) of the first light emission region (Gs) is formed on the input side focal plane thereof, by paying attention to the last lens (Ef13).

Moreover, since the third light emission region (Gf) is conjugate to the second light emission region (Gu), which is conjugate to the exit pupil (Qu) of the collimating lens (Es), so that it is only necessary for the third light emission region (Gf) to serve as an exit pupil of the last lens (Ef13), what is needed is just to form this on the output side focal plane of the last lens (Ef13).

Therefore, since what is needed is to make all the principal rays of the conjugate image (Nf) parallel to the z axis which is an optical axis, on the basis of the case where the deflection angle of the deflection mirror (Mdm) is zero, the third light emission region (Gf), which is conjugate to the second light emission region (Gu), which is conjugate to the exit pupil (Qu) of the collimating lens (Es), may be located on an input side focal plane of the lens (Ef21). As mentioned above, in the coherent light source apparatus shown in FIG. 14, since the third light emission region (Gf) is formed as an exit pupil on the incident end (Pmi) of the light mixing unit (Fm), the third light emission region (Gf) becomes compact. Moreover, if the magnification of the image formation to the third light emission region (Gf) is adjusted and the size of the incident end (Pmi) is matched therewith, since the distribution range of the angle of the light rays contained in light flux can be made small, it is advantageous in solving the problem that the uniformity of the light projected deteriorates due to the speckle while avoiding side effects such as a flicker etc. appearing due to interference of time-peridic modulation.

Moreover, description of a coherent light source apparatus shown in FIG. 15 will be given below. Similarly to that described above with respect to FIG. 13, a first light emission region (Gs) is formed by a radiant section of diffusing light which exists on a surface of a semiconductor chip in a semiconductor laser light source unit (Ls) whose light source is made up of one or two or more semiconductor lasers. In the first optical system (Eu) which is made up of a collimating lens (Es) for changing it into an image at infinity, and an imaging lens (Eu1), an image of a second light emission region (Gu) is formed on a deflection mirror (Mdm), as an image conjugate to the first light emission region (Gs).

In addition, where the light source of the semiconductor laser light source unit (Ls) is made up of two or more semiconductor lasers, although it is configured based on the case where all the principal rays from the first light emission region (Gs) are parallel to an optical axis, even if they are not parallel, the optical system having similar functions can be realized by controlling and designing the position of the image plane on an optical axis and a pupil position. When all the principal rays from the first light emission region (Gs) described right above are parallel to the optic axis, since the exit pupil (Qu) of the collimating lens (Es) is formed at the output side focal point of the collimating lens (Es), the exit pupil (Quo) of the first optical system (Eu) is formed as an image by the imaging lens (Eu1) to the exit pupil (Qu) of the collimating lens (Es).

As described above, because an input image from the first light emission region (Gs) to the imaging lens (Eu1) is at infinity, an output image, i.e., the second light emission region (Gu), is formed on an output side focal plane of the imaging lens (Eu1). Here, the exit pupil (Qu) of the collimating lens (Es) is arranged nearer the imaging lens (Eu1) than an output side focal plane of the imaging lens (Eu1). Therefore, it is assumed that the exit pupil (Quo) of the first optical system (Eu) is formed, as a virtual image of the imaging lens (Eu1), behind the imaging lens (Eu1).

Moreover, similarly to what is described in relation to FIG. 13, the deflection mirror (Mdm) functions as a light deflection unit (Md), and for example, the rotation rocking mirror using the rotary motor (Mdd), etc. are suitable therefor. And the rotary motor (Mdd) has a rotation sensor (Enr) as shown in FIG. 11A, wherein a rotation detection signal (Sen) is fed back, and it is driven by the light deflection unit drive circuit (Umd) so that the rotary motor (Mdd) may is rotated by a phase-locked loop in synchronization with an optical deflection synchronization signal (Syn).

The light flux (Bd) deflected by the light deflection unit (Md) enters the second optical system (Ef) which is made up of a collimating lens (Ef1). While this second optical system (Ef) forms an image at infinity, as a conjugate image to the second light emission region (Gu) on the deflection mirror (Mdm), an image of a third light emission region (Gf) is formed on an incident end (Pmi) of the light mixing unit (Fm) which is made up of a fly eye integrator provided downstream side of the second optical system (Ef).

In addition, in this case, since the second light emission region (Gu) is configured so as to be conjugate to the first light emission region (Gs), what is necessary is just to make arrangement so that the input side focal point of the second optical system (Ef) may be in agreement with the second light emission region (Gu), in order for the second optical system (Ef) to form an output image at infinity. Since, at this time, this second light emission region (Gu) is on the deflection mirror (Mdm) so that an immobility status may be approximately maintained by a deflection operation of the light deflection unit (Md), the position of the output image at infinity which is formed by the second optical system (Ef), i.e., the angle with respect to a z axis, is approximately kept constant.

Therefore, if the optical system is adjusted appropriately from the beginning, as described in relation to FIG. 7, at all the positions of the third light emission region (Gf) which continuously changes by an operation of the light deflection unit (Md), the principal ray from the center image point of the first light emission region (Gs) contained in the light flux (Bf) which forms the third light emission region (Gf) can be maintained so as to be parallel to the z axis.

FIG. 16 is a conceptual diagram showing a front elevational view of the light mixing unit (Fm) which is made up of a fly eye integrator, wherein many Koehler illumination upstream side lenses are aligned in a matrix, which are described in relation to FIG. 22. The figure shows that when the rotation rocking mirror is used for the light deflection unit (Md), the third light emission region (Gf) formed on the incident end (Pmi) of the light mixing unit (Fm) changes with a change in a deflection direction by the light deflection unit (Md), wherein the center of the third light emission region (Gf) moves so that a circle may be drawn by a trajectory (Cg) thereof. Moreover, a region (Gf') and a region (Gf") are drawn so as to correspond to those with same reference numerals shown in FIG. 7.

Figure 15:
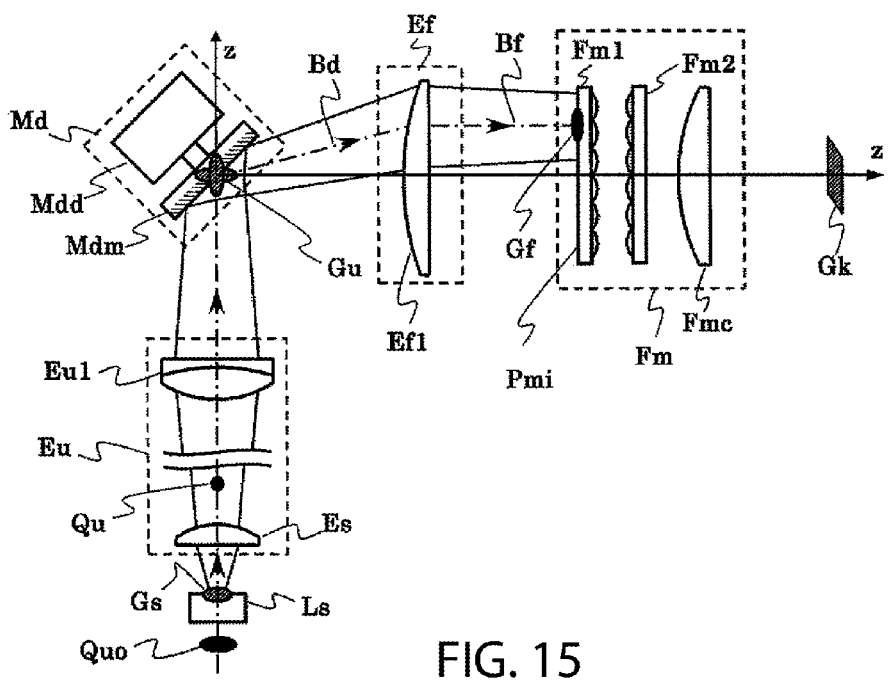
FIG. 15 is a simplified diagram showing an aspect of a coherent light source apparatus according to an embodiment of the present invention.

By such configuration, which is described above, in the coherent light source apparatus shown in FIG. 15, since the third light emission region (Gf) is formed as an exit pupil on the incident end (Pmi) of the light mixing unit (Fm), the third light emission region (Gf) becomes compact. Moreover, since an image conjugate to the first light emission region (Gs) is formed at a distant place, and with an operation of the deflection mirror (Mdm), the third light emission region (Gf) may move continuously on the incident end (Pmi), while the principal ray from the center image point of the first light emission region (Gs) contained in the light flux (Bf) which forms the third light emission region (Gf) is maintained on a condition where they are parallel to an axis (z axis) of the light mixing unit (Fm) and since to the time-periodic modulation added to the output light from the coherent light source apparatus according to the embodiment of the present invention, the deflection mirror (Mdm) is controlled so as to operate in synchronization with the synchronized optical deflection synchronization signal (Syn), it is advantageous in solving the problem that the uniformity of the light projected deteriorates due to a speckle while avoiding side effects such as a flicker etc. appearing due to interference of time-peridic modulation.

Figure 18A:
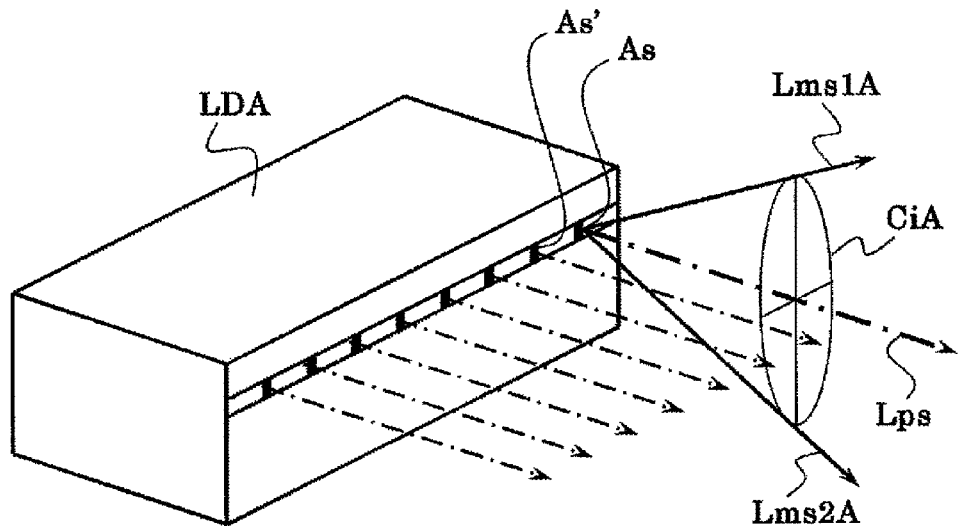
FIGS. 18A and 18B are simplified and schematic diagrams showing an aspect of a member relating to a coherent light source apparatus according to an embodiment of the present invention.
Figure 18B:
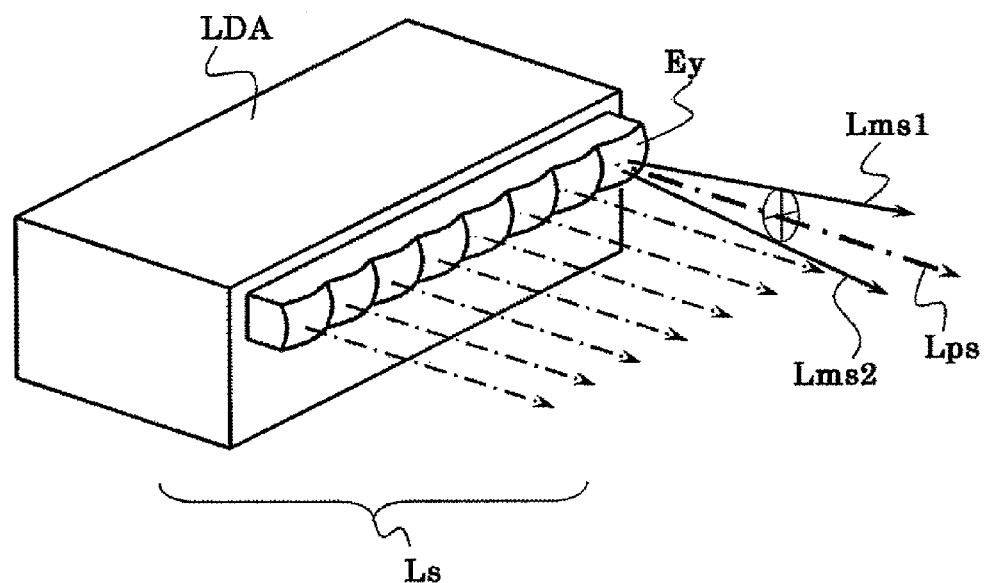
Figure 19A:
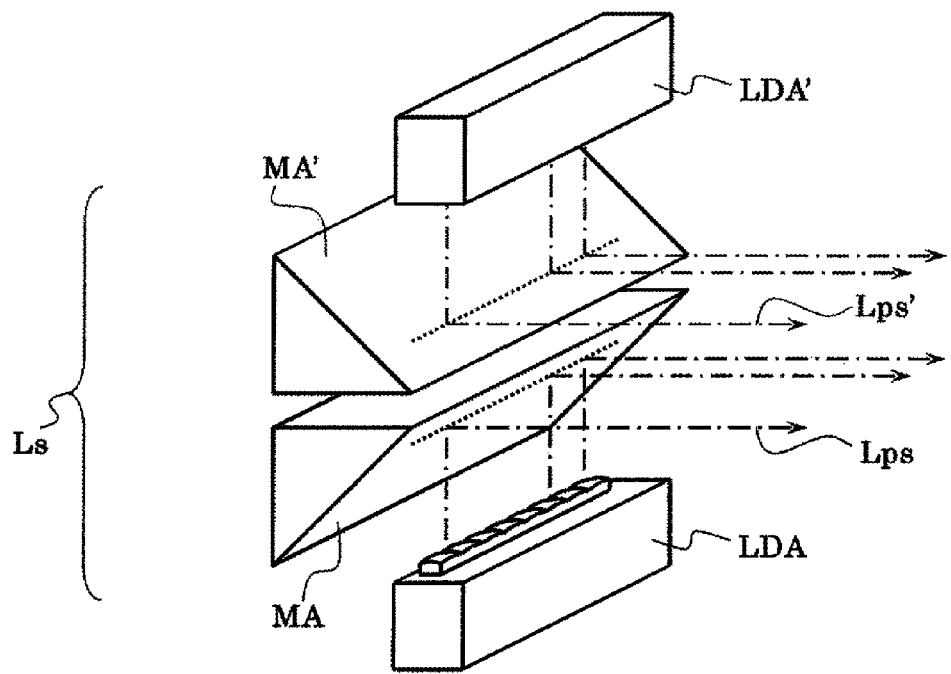
FIGS. 19A and 19B are simplified and schematic diagrams showing an aspect of part of a coherent light source apparatus according to an embodiment of the present invention.
Figure 19B:
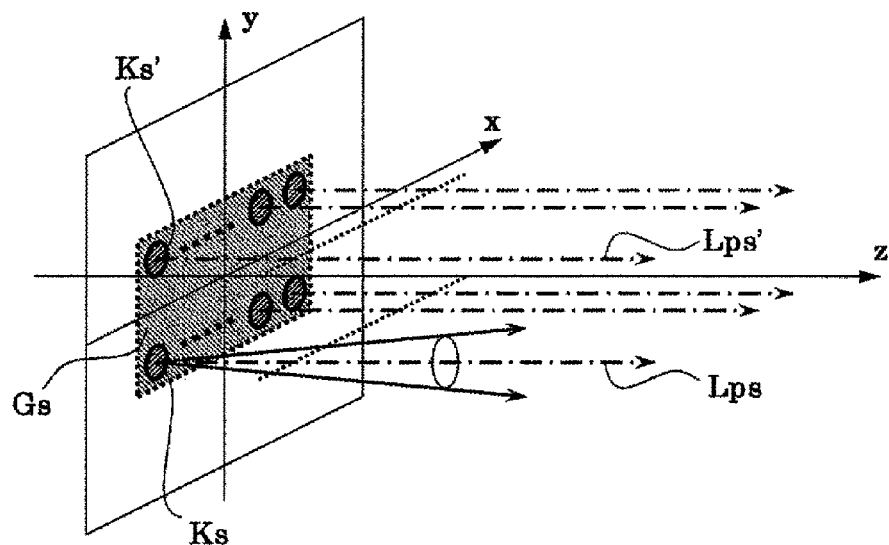

The semiconductor laser light source unit (Ls) which includes two or more semiconductor lasers is described above. The realization thereof will be explained briefly below. As shown in FIG. 17, the required number of discrete type semiconductor laser light sources (Ds, Ds', . . . ), in each of which a semiconductor laser having one radiant point is accommodated, is aligned in a metal casing which is made of sapphire etc. and which has a window, and collimating lenses (Ec, Ec', . . . ) are respectively attached thereto, whereby after diverging light from each semiconductor laser is changed into parallel beam i.e., an image point at infinity, and a beam sequence (Ba), which has desired beams and intervals, is formed using a beam synthesizing mirror (MD, MD', . . . ), it is changed into the radiant points (Ks, Ks', . . . ) at a finite distance by divergent lenses (Ex, Ex', . . . ), which are aligned and arranged corresponding to the number of beams, whereby the principal rays (Lps, Lps', . . . ) from the radiant points (Ks, Ks', . . . ) becomes approximately parallel to one another, so that the situation shown in FIG. 4 and explained therewith can be realized. Therefore, the radiant points (Ks, Ks', . . . ) shown in FIG. 17 are suitable for use in the semiconductor laser light source unit (Ls) shown in FIG. 13 or FIGS. 14 and 15. In the coherent light source apparatus according to the embodiment of the present invention, in addition to the above described discrete type semiconductor laser light sources, a semiconductor laser array device (LDA) shown in a conceptual diagram of FIGS. 18A and 18B may be also used. The semiconductor laser active regions (As, As', . . . ) are laid out in a line on the end surface of this semiconductor laser array device (LDA), and diverging light is emitted from each semiconductor laser active region (As, As', . . . ). Either in a discrete type or an array type, the divergence angle of the radiant beam of an end face emission type semiconductor laser becomes large under the influence of diffraction phenomena. The divergence angle in a direction perpendicular to a board surface (of a semiconductor chip of the semiconductor laser), is especially large as shown as marginal rays (Lms1A, Lms2A), that is, there is a characteristic that a bottom face (CiA) of a cone that represents a range of the emission angle, becomes a remarkable ellipse instead of a circle. Although a collimating lens is used in order to change this radiant beam into a collimated beam, it is necessary to use that having a short focal distance according to a component in a direction perpendicular to the board surface where a divergence angle is large. Even if such a collimating lens is used, in the case of a discrete type semiconductor laser, although there is no big problem if it does not mater even if a beam becomes flat. In the case of an array type semiconductor laser, when all the radiant beams of the semiconductor laser active region (As, As', . . . ) are changed into collimated beams by one collimating lens, since a focal distance is short, there is a problem that the principal rays of the semiconductor laser active regions (As, As', . . . ) respectively have a large angle with respect to one another. Therefore, an emission angle correction lens array (Ey) as shown in FIG. 13B can be used therefor. This emission angle correction lens array (Ey) individually performs collimation to each radiant beam from the semiconductor laser active region (As, As', . . . ), and in order to solve the problem that the divergence angle in a direction perpendicular to the board surface is large, a refractive surface of each emission angle correction lens array (Ey) is molded so as not to be a spherical surface but so as to be a toric surface in which a curvature radius thereof in a direction perpendicular to a board surface differs from that in a direction parallel thereto. While the divergence angle in a direction parallel to the board surface is reduced as in the marginal rays (Lms1, Lms2), the divergence angle in a direction perpendicular to the board surface decreases more than that, and ideally the divergence angle in a direction parallel to the board surface and that in perpendicular thereto are made approximately equal to each other. Because the principal rays (Lps) from the semiconductor laser active regions (As, As', . . . ) are parallel to one another, the beam sequence is compact, and the semiconductor laser array device (LDA) with the emission angle correction lens array (Ey) shown in FIGS. 18A and 18B can be suitably used as the semiconductor laser light source unit (Ls) shown in FIG. 13 or FIG. 14. Instead of realizing such a toric surface, a cylindrical lens which has a curvature in a direction perpendicular to the board surface and which is common to the semiconductor laser active region (As, As', . . . ), and a cylindrical lens arrangement, which has a curvature in a direction parallel to the board surface, and which is individually provided for each semiconductor laser active region (As, As', . . . ), is prepared, whereby it is possible to realize a similar function to the emission angle correction lens array (Ey) by the combination. Moreover, FIG. 19A shows a configuration example in which two semiconductor laser array devices (LDA) with an emission angle correction lens array (Ey) are used together. The beam sequences from the semiconductor laser array devices (LDA, LDA') are synthesized so as to form a batch of beams by using a beam synthesizing mirror (MA, MA'). In that case, it is preferable to arrange them so that all the principal rays (Lps, Lps', . . . ) from the respective semiconductor laser array devices (LDA) may be parallel to one another. Although it is suitable to use the semiconductor laser array devices (LDA, LDA') shown in FIG. 13 or FIG. 14 as the above-described semiconductor laser light source unit (Ls), FIG. 19B shows a state of the first light emission region (Gs) formed thereby. Of course, more semiconductor laser array device(s) can be added so that output light may pass between the above-mentioned beam synthesizing mirrors (MA, MA'). It is possible to add much more semiconductor laser array devices by the same method as what is previously shown in FIG. 17.

A configuration will be explained referring to FIG. 20, in which a single color first light emission region (Gs) is formed for each color, and they are overlaid by using a color-synthesis unit such as a dichroic mirror and the light is sent to the first optical system (Eu), so that the first light emission region (Gs), where the color synthesized first light emission region (Gs) is formed, can be formed. In the optical system shown in this figure, a portion which is on upstream side of an imaging lens (Eu1) of a first optical system (Eu) is changed from what is previously explained about FIG. 13. Radiant sections of diverging light, which exist on a surfaces of the semiconductor chip in the respective semiconductor laser light source units (LsR, LsG, LsB) of color of R-G-B, are shown as a first light emission region (GsR, GsG, GsB), and the color synthesis of the light flux, which is changed into an image at infinity by the collimating lenses (EsR, EsG, EsB), is carried out, using a mirror (HuR) and dichroic mirrors (HuG, HuB), so as to be inputted into the imaging lens (Eu1). The action of the imaging lens (Eu1) and that of the optical system, which is on a downstream side therefrom are the same as those shown in FIG. 13. Of course, part of the optical system, which is upstream of the imaging lens (Eu1) shown in FIG. 16, can be also applied to the coherent light source apparatus shown in FIG. 14.

Figure 20:
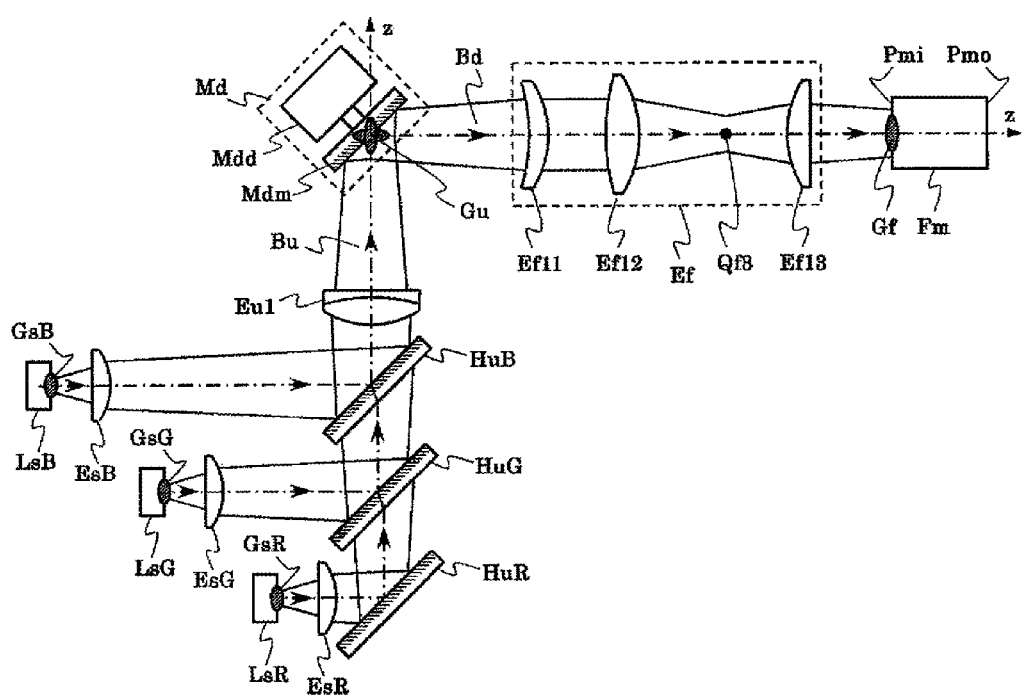
FIG. 20 is a simplified diagram showing an aspect of a coherent light source apparatus according to an embodiment of the present invention.

Although in the above explanation, the first light emission region (Gs) and the first light emission regions (GsR, GsG, GsB) in the coherent light source apparatus shown in FIGS. 13, 14 and 20, are formed by a semiconductor laser light source unit, they may be replaced with a first light emission region (Gs), which is formed by the emission end (Pto) of the optical fiber (Fb), where light of a coherent light source (Sc), as shown in FIG. 8 or FIG. 9, is inputted from an incident end thereof.

Although the optical guide and the fly eye integrator are described as the light mixing unit (Fm) in this specification, as described above, other devices may be applied, as long as these device can mix an angle component and a position component of incident light. In that case, in order not to decrease the light use efficiency, it is advantageous to select a device, which does not increase the angle of the light rays with respect to an optical axis. Although, for example, in case where diffusion is utilized, although a spotty or patchy pattern of the speckle becomes fine so that a function for making it difficult to see them is enhanced, since there is a function for shifting the angle distribution of light rays to a side on which an angle is large, cautions are required in use. Moreover, the above-described optical guide may have not only a simple quadratic prism shape but also, for example, a shape where a quadrangle in a cross section perpendicular to a z axis, i.e., an optical axis, rotates as getting close to a front side thereof on an axis, that is, a shape where a quadratic prism is twisted with respect to the axis, or a shape where although an emission end (Pmo) has a quadrangle, an incident end (Pmi) has a different shape (for example, circular), that is, a shape where as getting close to a front side on an axis, a quadrangle in a section perpendicular to an optical axis changes so that, for example, the shape of the cross section thereof continuously changes from a round shape to a quadrangle through a polygon whose number of sides is larger, whereby mixing is increased and a spotty or patchy pattern of the speckle becomes fine, so that a function for making it difficult to see can be enhanced. However, in the case where the area of a cross section perpendicular to an optical axis decreases as moving to the front side on the axis, since as light propagates toward the front side, an angle thereof with respect to a side face increases every time it is reflected on a side face, cautions are required in order to shift angle distribution of the rays to a side where the angle is large. Although in the above-described embodiment, the rotation rocking mirror consisting of the deflection mirror (Mdm) and the mirror rotation motor (Mdd) is given as the light deflection unit (Md) are used as an example, any device can be used therefore, as long as the angle of light flux can be deflected. For example, it is possible to use a rotation non-parallel glass plate where a glass plate whose cross section is wedge shape is rotated, a rotation image rotating prism (a Dove prism, a trapezoidal prism, a prism in which a deflection face is replaced with a reflective face, etc.), which is rotated with respect to an axis. Since a device for rotating an optical element such as the rotation rocking mirror, the rotation non-parallel glass plate, or the rotation image rotating prism, can reduce mechanical vibration, compared with those having a structure for deflecting an angle in a back and forth manner, they are suitable among them as a light deflection unit according to the embodiments of the present invention. Moreover, since they rock as if a trajectory in a deflection direction draws a circular conical face with rotation of the optical element, even if the light use efficiency decreases according to a deflection in, for example, a light mixing unit (Fm) or a downstream part thereof, the deflection angle with respect to a central axis is constant in case there is no deflection, so that there is an advantage that the phenomenon in which the light use efficiency changes depending on the deflection angle, hardly arises. In contrast to this, in the case where an angle is deflected in a back and forth manner, since a mechanical vibration tends to be large, and in addition the light use efficiency is high at a center of a deflection whereby since the light use efficiency decreases as a deflection angle increases toward the outside from a center of deflection, that is, the drawback that the phenomenon where the light use efficiency changes, tends to arise, cautions are required. As generally known in the field of lens design, it is also possible to change the structure of an optical system which is made up of one lens, to that of an optical system which is made up of a combination of two or more lenses having the same function thereas, or to change it to a reverse structure. Especially, even when the focal distance of an object optical system is the same, the former structure modification is used in order that a function, which cannot be physically achieved by one lens, can be realized by setting an input side principal point position and an output side principal point position to a convenient position or adopting an afocal system, or in order that the aberration is decreased by distributing lens power to two or more lenses. Although in the above-described embodiments, the first optical system (Eu) and the second optical system (Ef) are configured as a combined lens system which is made up of two or more lenses, it is possible to improve performance thereof and cost thereof by utilizing the above-described structure modification, or by increasing or decreasing the number of lenses using an aspheric lens. Moreover, as a result of the structure modification, there are cases where, for example, the entrance pupil (Qf3), which is described above with respect to FIG. 13, or the conjugate image (Nu) or the conjugate image (Nf), which are described above with respect to FIG. 14, are provided inside an optical system, so that it cannot be sometimes checked by placing a screen. However, there is still no particular problem. As industrial utility, the present invention can be used in the industries where a coherent light source apparatus, which can be used in an optical device such as a projector, and which uses a coherent light source such as laser etc., is designed and manufactured.

What is claimed is:

1. A coherent light source apparatus comprising:
a first optical system (Eu), which has a first light emission region (Gs) formed by a coherent light source (Sc), and which projects light from the first light emission region (Gs) so as to form a second light emission region (Gu);
a light deflection unit (Md) which deflects light flux (Bu) in connection with formation of the second light emission region (Gu) near the second light emission region (Gu);
a second optical system (Ef), which is provided in a downstream side of the light deflection unit (Md), and which forms a third light emission region (Gf) in response to the light flux (Bu) which has been deflected by the light deflection unit (Md);
a light mixing unit (Fm) for mixing a component of an incident light angle and that of a position thereof, which is provided on a downstream side of the second optical system (Ef), and which has an incident end (Pmi) near the third light emission region (Gf); and
a light deflection unit drive circuit (Umd) for receiving a periodic optical deflection synchronization signal (Syn) inputted from the outside, thereby driving the light deflection unit (Md),
wherein the light deflection unit (Md) operates so as to continuously change a direction in which the light flux (Bu) is deflected while synchronizing with the optical deflection synchronization signal (Syn).

2. The coherent light source apparatus according to claim 1, wherein the light mixing unit (Fm) is an optical guide in which light is confined in a predetermined space and the light is repeatedly reflected therein so as to be guided.

3. The coherent light source apparatus according to claim 1, wherein the light mixing unit (Fm) is a fly eye integrator.

4. The coherent light source apparatus according to claim 1, wherein the second optical system (Ef) generates the third light emission region (Gf) which is conjugate to the second light emission region (Gu).

5. The coherent light source apparatus according to claim 1, wherein the second optical system (Ef) generates, at a distance, an image, which is conjugate to the first light emission region (Gs), and generates a third light emission region (Gf), which is approximately conjugate to an exit pupil (Quo) of the first optical system (Eu), wherein the third light emission region (Gf) is continuously moved on the incident end (Pmi) by an operation of the light deflection unit (Md).

6. The coherent light source apparatus according to claim 1, wherein the first light emission region (Gs) is formed on an emission end (Pto) of the optical fiber (Fb) where light of a coherent light source (Sc) is inputted from an incident end.

7. A coherent light source apparatus according to claim 1, wherein the light deflection unit (Md) rotates an optical element for a deflection by a rotary motor (Mdd), and the rotary motor (Mdd) includes a rotation sensor (Enr) which generates a rotation detection signal (Sen) at every predetermined rotation angle, wherein the light deflection unit drive circuit (Umd) includes a rotation detection signal frequency demultiplier (Uen) which turns the rotation detection signal (Sen) into a frequency demultiplier rotation detection signal (Sden) which is divided by a natural number, and a phase comparison drive control circuit (Upc) which adjusts drive capability by comparing a phase of the optical deflection synchronization signal (Syn) with that of the dividing rotation detection signal (Sden), so as to increase the number of rotations of the rotary motor (Mdd) when the phase of the dividing rotation detection signal (Sden) is retarded from the optical deflection synchronization signal (Syn), and so as to decrease the number of rotations of the rotary motor (Mdd) may when it is advanced, and wherein the rotary motor (Mdd) is rotated by a phase-locked loop in synchronization with the optical deflection synchronization signal (Syn).

8. The coherent light source apparatus according to claim 1, wherein the light deflection unit drive circuit (Umd) has a frequency demultiplier condition setting interface (Uif), wherein a dividing ratio Nd for dividing the rotation detection signal (Sen) by the natural number is set up from the outside thereof through the frequency demultiplier condition setting interface (Uif).

9. A projector, which uses the coherent light source apparatus according to claim 1 so as to project an image for display, wherein while a light uniformizing unit serves as the light mixing unit (Fm), and an image signal generation circuit (Ur) which controls a two-dimensional light amplitude modulation element (Dmj) generates the optical deflection synchronization signal (Syn).

\* \* \* \* \*